(12) United States Patent
Fletcher et al.

(10) Patent No.: US 8,054,208 B2
(45) Date of Patent: Nov. 8, 2011

(54) RE-CONFIGURABLE MULTIPURPOSE ANALOG INTERFACE

(75) Inventors: Mitch Fletcher, Glendale, AZ (US); Jef Sloat, Phoenix, AZ (US); Michael R. Gregg, Sun City, AZ (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 12/750,341

(22) Filed: Mar. 30, 2010

(65) Prior Publication Data

US 2011/0241916 A1 Oct. 6, 2011

(51) Int. Cl.
*H03M 1/00* (2006.01)
(52) U.S. Cl. .................... 341/141; 341/139; 341/155
(58) Field of Classification Search .............. 341/126, 341/139, 144, 155
See application file for complete search history.

(56) References Cited

U.S. PATENT DOCUMENTS

| | | |
|---|---|---|
| 3,543,048 A | 11/1970 | Klaschka |
| 4,370,706 A | 1/1983 | Doniger et al. |
| 4,486,826 A | 12/1984 | Wolff et al. |
| 4,903,270 A | 2/1990 | Johnson et al. |
| 4,967,347 A | 10/1990 | Smith et al. |
| 4,991,174 A | 2/1991 | Mori et al. |
| 5,276,690 A | 1/1994 | Lee et al. |
| 5,349,691 A | 9/1994 | Harrison et al. |
| 5,373,508 A | 12/1994 | Guliani |
| 5,513,527 A | 5/1996 | Griffiths |
| 5,581,739 A | 12/1996 | FitzPatrick |
| 5,586,124 A | 12/1996 | Nicolaidis |
| 5,602,828 A | 2/1997 | Engdahl et al. |
| 5,758,058 A | 5/1998 | Milburn |
| 5,805,797 A | 9/1998 | Sato et al. |
| 5,937,202 A | 8/1999 | Crosetto |
| 6,023,774 A | 2/2000 | Minagawa |
| 6,085,350 A | 7/2000 | Emmert et al. |
| 6,150,836 A | 11/2000 | Abbott |
| 6,255,972 B1 * | 7/2001 | Gross et al. ............... 341/126 |
| 6,260,087 B1 | 7/2001 | Chang |
| 6,289,024 B1 | 9/2001 | Toillon |
| 6,311,149 B1 | 10/2001 | Ryan et al. |
| 6,448,914 B1 * | 9/2002 | Younis et al. .............. 341/141 |
| 6,604,177 B1 | 8/2003 | Kondo et al. |
| 6,721,581 B1 | 4/2004 | Subramanian |
| 6,731,232 B1 | 5/2004 | Kearney |
| 6,804,292 B2 * | 10/2004 | Liu et al. .................... 375/222 |
| 6,825,689 B1 * | 11/2004 | Snyder .......................... 326/41 |

(Continued)

OTHER PUBLICATIONS

USPTO Office Action for U.S. Appl. No. 12/886,276; Notification date Jun. 20, 2011.

*Primary Examiner* — Khai M Nguyen

(74) *Attorney, Agent, or Firm* — Ingrassia Fisher & Lorenz, P.C.

(57) ABSTRACT

Systems and apparatus are provided for interfacing a digital controller with an analog input means. The system comprises a digital controller with the input of the digital controller coupled to the output of the analog-to-digital converter. The system further comprises a digital-to-analog converter coupled to an analog interface circuit. The analog interface circuit comprises a reconfigurable RC network switchably coupled to a first amplifier or to a second amplifier. The analog interface circuit further comprises a third amplifier having an input being coupled to an output of the second amplifier and the output of the third amplifier being coupled to the one or more input signal paths to the first amplifier.

19 Claims, 18 Drawing Sheets

U.S. PATENT DOCUMENTS

| | | |
|---|---|---|
| 6,864,822 B2 | 3/2005 | Gulati et al. |
| 6,948,091 B2 | 9/2005 | Bartels et al. |
| 7,049,989 B2 | 5/2006 | Runals et al. |
| 7,072,779 B2 | 7/2006 | Hancock et al. |
| 7,190,748 B2 | 3/2007 | Kim et al. |
| 7,215,197 B2 | 5/2007 | Regier |
| 7,301,362 B2 | 11/2007 | Jang et al. |
| 7,369,078 B2 * | 5/2008 | Nickel et al. ............ 341/155 |
| 7,405,682 B2 | 7/2008 | Ebner et al. |
| 7,408,495 B2 | 8/2008 | Stein et al. |
| 7,411,538 B1 * | 8/2008 | Piasecki ............ 341/161 |
| 7,505,400 B2 | 3/2009 | Bibby et al. |
| 7,516,303 B2 | 4/2009 | Kundu et al. |
| 7,548,590 B2 | 6/2009 | Koller et al. |
| 7,584,345 B2 | 9/2009 | Doering et al. |
| 7,589,649 B1 | 9/2009 | Aga et al. |
| 7,602,274 B2 | 10/2009 | Lee et al. |
| 7,609,100 B2 | 10/2009 | Nagata |
| 7,673,087 B1 | 3/2010 | Ansari et al. |
| 7,715,433 B2 | 5/2010 | Boren |
| 7,791,370 B1 | 9/2010 | Hoang et al. |
| 2006/0010438 A1 | 1/2006 | Brady, Jr. et al. |
| 2006/0038710 A1 | 2/2006 | Staszewski et al. |
| 2007/0126584 A1 | 6/2007 | Hyde et al. |
| 2008/0297388 A1 | 12/2008 | Thiagarajan et al. |
| 2009/0140809 A1 | 6/2009 | Chi |
| 2009/0175381 A1 | 7/2009 | Bougard |
| 2010/0005366 A1 | 1/2010 | Dell et al. |

* cited by examiner

RE-CONFIGURABLE MULTIPURPOSE ANALOG INTERFACE

TECHNICAL FIELD

The present invention generally relates to signal interface circuitry, and more particularly relates to an analog signal interface that is reprogrammable for different purposes in real time.

BACKGROUND

It is estimated that it currently costs about $1 million per kilogram to put a payload on the lunar surface. Further, limited power generating capability and the subsequent heat load produced by onboard electronic circuitry result in operating issues that constrain the capability of a spacecraft of any given size and configuration. Therefore the cost, size, weight and capability of spacecraft components are always issues of concern. Frequently, trade offs must be made between cost, weight and size and capability.

Spacecraft command and control electronics are indispensable and their complexity increases geometrically as demand for system capability grows. Command and control electronics monitor the condition of various conditions and various components of the spacecraft using a plurality of analog and digital sensors/transducers. The command and control electronics are programmed to make a decision based in part on sensor input and cause the spacecraft to do something via a plurality of mechanical actuators that may be analog or digital devices.

In the analog world, a signal may be derived that represents a particular physical parameter. Non-limiting examples of such parameters include temperature, displacement, pressure, flow rate, force and acceleration. This derivation is accomplished with an appropriately configured sensor or transducer, which converts the physical quantity into an electrical voltage or current. Such sensors are typically located remotely from the command and control electronics and require a signal conditioning system to preprocess the voltage or current for use by the command and control electronics.

Specifically, a signal conditioning system is used to prepare input signals for data acquisition and processing. Signal conditioning includes such exemplary processes as anti-aliasing, amplification, attenuation and filtering. After conditioning, the processed signals may be transmitted to a sample-and-hold circuit that keeps a signal sample stable for subsequent conversion to a digital form by an analog-to-digital converter (AD).

Further, actuators are used in a spacecraft to impart an action that controls the spacecraft. Positional thrusters are but one non-limiting example of actuators onboard a spacecraft. Actuators may be analog devices that are controlled by a digital controller or a processor. To provide analog control signals to the plurality of actuators, each control signal must be converted from a digital form to an analog form, must be processed into a form to properly drive a particular actuator, and then be transmitted to the actuator.

Given that signal processing circuitry is indispensable, it is desirable to minimize the size and weight of any such electronics package to reduce launch costs. In addition, it is desirable to minimize the heat generated by the electronics package. Other desirable features and characteristics of the present invention will become apparent from the subsequent detailed description of the invention and the appended claims, taken in conjunction with the accompanying drawings and this background of the invention.

Although discussed herein in the context of a spacecraft or satellite, the subject matter disclosed herein may be applied to other types of vehicles or other electronic systems. Any reference to spacecraft applications is merely exemplary and is not intended to limit the scope of the following disclosure in any way.

BRIEF SUMMARY

A reconfigurable analog interface is provided. The interface comprises a means for receiving a first of one or more analog inputs and a means for outputting an analog output. The interface also comprises a first means for amplifying where the output of the first means for amplifying is coupled to the means for outputting an analog output and the input is coupled to the means for receiving one or more analog inputs. The interface also includes a means for filtering and gain control that is switchably coupled to the input of the first amplifying means and switchably coupled to a second means for amplifying. A third means for amplifying is included where the input of the third means for amplifying is switchably coupled to the output of the second means for amplifying and the output of the third means for amplifying is coupled to the means for receiving the one or more analog inputs. Each of the components of the interface are controlled by a means for switching that is configured to switchably connect the means for filtering and gain control to the input of the first amplifying means, to switchably connect the means for filtering and gain control to the input of the second means for amplifying and to switchably connect the output of the second means for amplifying to the input of the third means for amplifying.

A system is provided for interfacing a digital controller with an analog input means. The system comprises: an analog-to-digital converter with an input and an output and a digital controller with an input and an output, the input of the digital controller coupled to the output of the analog-to-digital converter. The system further comprises a digital-to-analog converter with an input and an output, the input of the digital-to-analog output coupled to the output of the central controller; and an analog signal conditioning circuit with a plurality of inputs and a plurality of outputs, a first input of the of the plurality being coupled to the output of the digital-to-analog controller and a first output of the plurality being couple to the input of the analog-to-digital converter. The digital controller is configured to provide digital timing and configuration inputs to each of the analog-to-digital converter.

BRIEF DESCRIPTION OF THE DRAWINGS

The present invention will hereinafter be described in conjunction with the following drawing figures, wherein like numerals denote like elements.

DETAILED DESCRIPTION

The following detailed description is merely exemplary in nature and is not intended to limit the invention or the application and uses of the invention. Furthermore, there is no intention to be bound by any theory presented in the preceding background or the following detailed description.

The instant disclosure is provided to further explain in an enabling fashion the best modes of making and using various embodiments in accordance with the subject matter enclosed herein. The disclosure is further offered to enhance an understanding and appreciation of the novel principles and advantages thereof, rather than to limit in any manner the invention. The invention is defined solely by the appended claims including any amendments made during the pendency of this application and all equivalents of those claims as issued.

The subject matter disclosed herein provides for a re-configurable signal conditioning circuit with multiple input and output modalities. Elements normally associated with input signal conditioning functionality are uniquely combined with elements normally associated with output conditioning functionality, thereby allowing efficient dual and triple uses of particular circuit elements for various modes of operation.

The unique incorporation of particular multiple-use elements reduces size, weight, power consumption and heat load of an electronics package in which it is incorporated. For example, the novel signal conditioning circuit design disclosed herein below is an input/output (I/O) circuit that utilizes a pair of terminals that may be configured as input or output terminals.

When discussed herein below, the term "switch" means any type of electronic or physical device that opens and closes a current path through an electronic circuit. The term "switch" is used for clarity and should not be construed as limiting in any way. Non-limiting examples of switching devices that may also prove useful as contemplated here include electrically controlled mechanical switches, various types of transistors, diodes, contacts, nano-switches, Reed switches and the like as may currently exist or exist in the future.

Figure 1:
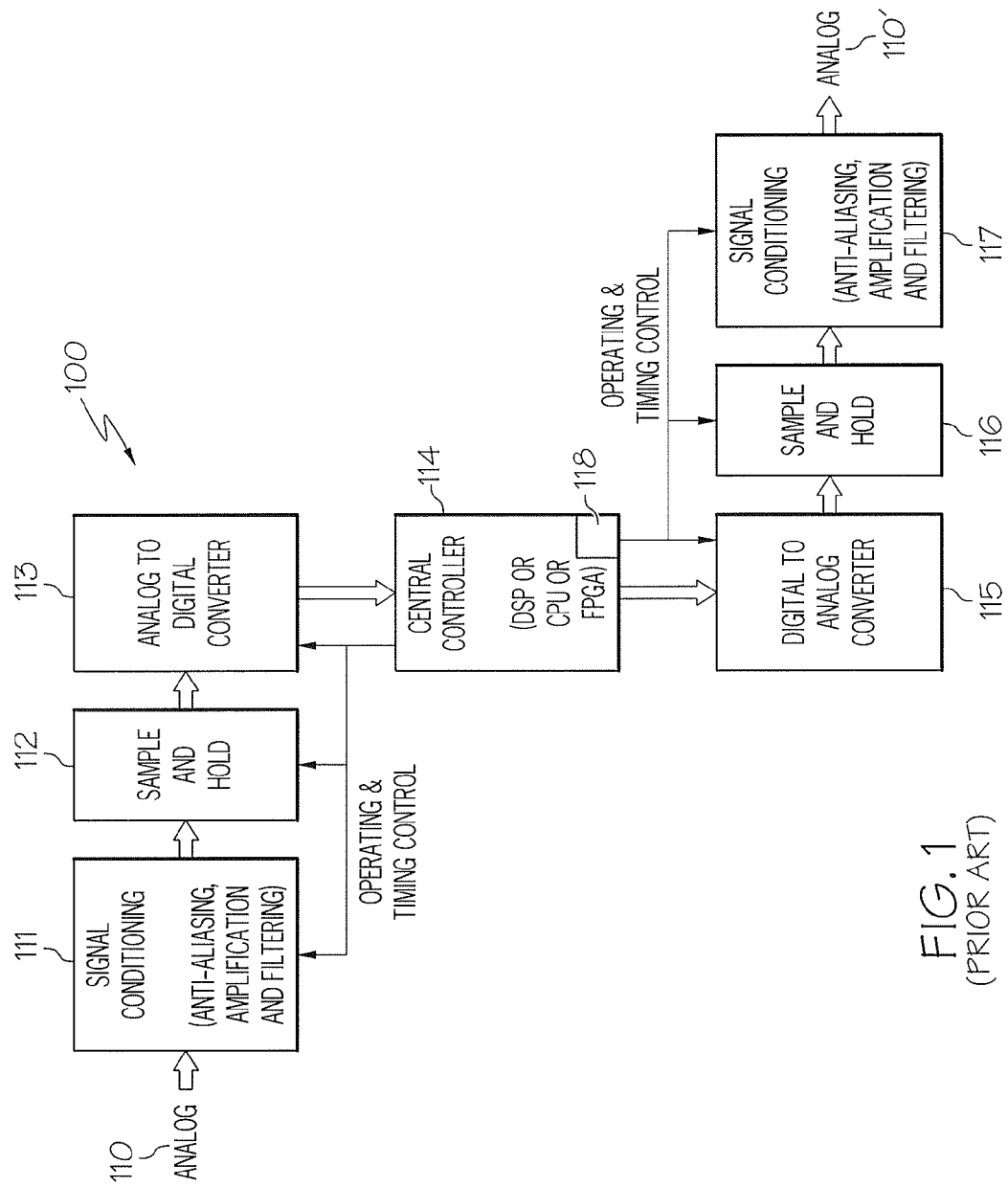
FIG. 1 is a block diagram of a typical prior art command and control system.

FIG. 1 illustrates a conventional command and control system 100. From the environment, an analog signal may be derived from various physical parameters such as temperature, displacement, pressure, flow rate, force and acceleration. This is accomplished with a suitably configured sensor or transducer which typically converts that physical quantity measured into an electrical voltage or current. Within any system, signal conditioning circuitry is used to prepare these analog input signals for data acquisition by other systems. Signal conditioning includes applying anti-aliasing, amplification, attenuation and filtering techniques to the input analog signal.

Similarly, an electronic system must interface output signals to the system environment to drive transducers or actuators. For example, if the actuator is a motor, then the correct direct current (DC) and alternating current (AC) analog signals must be generated to create the proper response from the motor.

In many fields, it may be important to incorporate test capabilities within the signal conditioning circuitry (111, 117) to verify circuit functionality, accuracy and integrity. One method of verifying the signal conditioning circuitry (111, 117) is to inject a known voltage or current into the input path of the signal conditioning circuit (111, 117) and then verify that the output is as expected. Similarly, an output signal can be verified by feeding the output signal into a dedicated input terminal so that the voltage of the output signal can be measured. When conducted within an electronic device, circuit testing is known as a built-in-test (BIT).

The system 100 includes an input analog signal conditioning module 111 whose purpose is to prepare an analog input signal 110 to be processed further by a central controller 114. The system 100 also may include one or more sample-and-hold modules (112, 116). Sample and hold modules typically act as signal sampling mechanisms to hold fixed a signal for input to other modules such as to analog-to-digital converter (AD) 113 or to hold fixed an output signal from a module such as a digital-to-analog converter 115 for input to another module such as an output signal conditioning circuit 117. A module, as the term is used herein, refers to any suitably configured hardware, software, firmware or combination thereof that performs an electronic function or carries out an executable instruction.

Analog-to-Digital converter 113 converts an analog signal to a digital signal. AD 13 allows the central controller 114 to receive the analog input signal 110 in a digital form. Conversely, Digital-to-Analog Converter (DAC) 115 converts digital output signals from the central controller 114 into analog output signals 110' for use by analog actuators, sensors and other devices (not shown) that are controlled by the central processor 114.

Central controller 114 typically has two functions. One function is to process the digitized input signal 110 according to a set of programmed instructions 118 recorded therein. Another function is to control any operating parameters of and timing among each component in the system 100.

Figure 2:
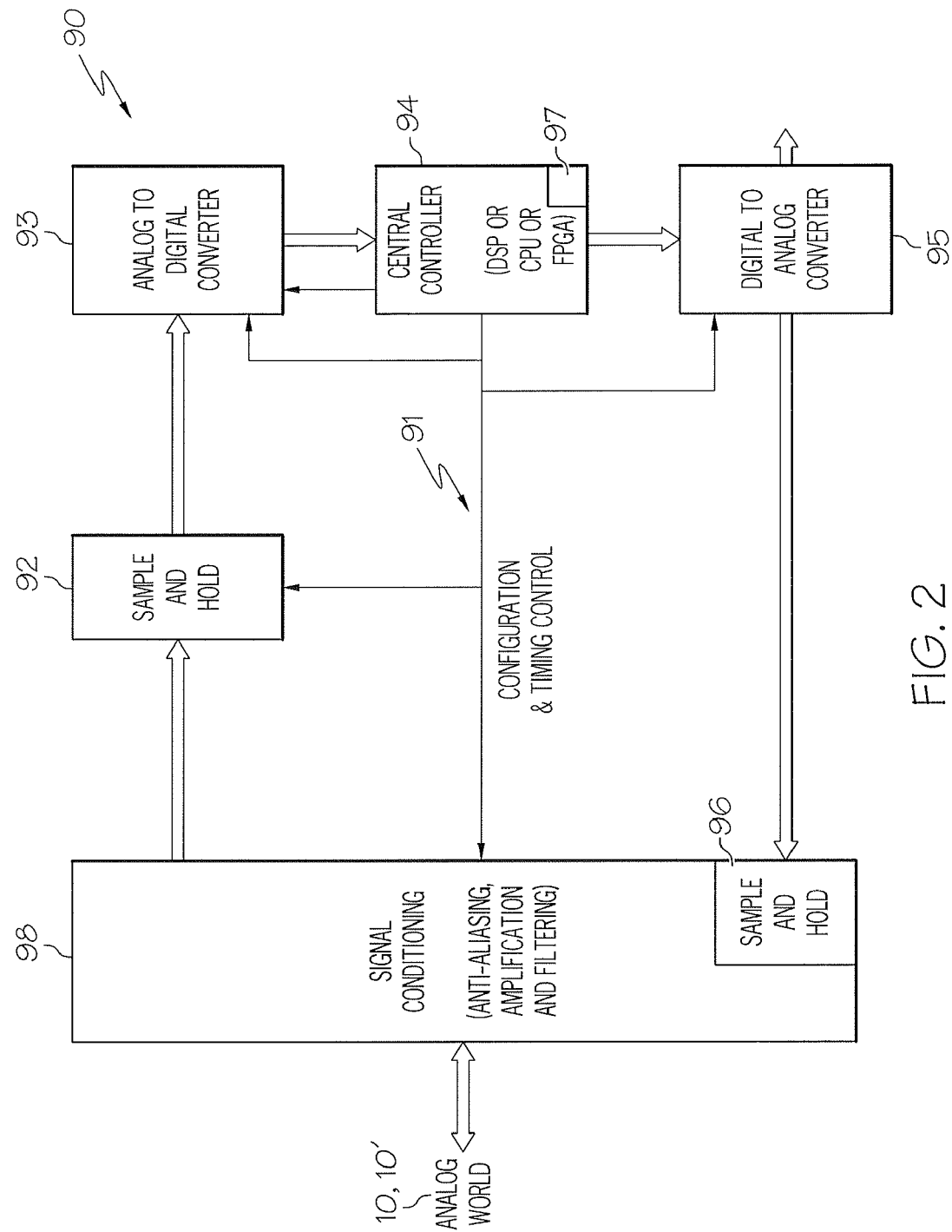
FIG. 2 is a block diagram of a novel command and control system according to the subject matter disclosed herein.

FIG. 2 is a block diagram of a novel analog input/output interface system 90 constructed in accordance with the subject matter disclosed herein. The system 90 provides for a multiple input and output functionality. Elements of input signal conditioning circuitry are uniquely combined with elements of output signal conditioning circuitry to allow multiple-uses of these elements in various modes of operation. The multiple-use of circuitry reduces the cost, weight, space, power consumption and heat generation requirements for the system 90, thereby allowing for a more efficient interface system in the aggregate. Further, by combining input and output functionality into a re-configurable electric circuit, a single pair of terminals may operate as input terminals or as output terminals. Therefore, greater pin utilization may be achieved by accommodating multiple functions.

The system 90 comprises a central controller 94. The term "controller" as used herein is intended to have a broad interpretation. The central controller 94 may be any suitable computing device that executes a set of instructions 97. For example, the central controller 94 may be a processor. Non-limiting examples of a processor include a standalone processor, a set of co-processors, a special purpose processor, a digital signal processor and a programmable logic device such as a field programmable gate array. The central controller 94 may comprise hardware, firmware, software or any combination thereof.

The instructions 97 being executed by the central controller 94 cause the central controller to perform a plurality of functions, serially or simultaneously. These functions may include the processing of a digital signal to satisfy a particular purpose and to control the re-configuration and/or timing of another component or module within system 90 by generating control signals in response to specific inputs. These inputs may be user inputs or sensor inputs.

The system 90 may also include one or more "sample-and-hold" modules, or circuits, such as sample-and-hold modules 92 and 96. The sample-and-hold modules 92 and 96 capture and hold a particular analog input signal for one purpose while the device generating the input signal is then freed up to drive another device elsewhere in the system 90 or to process a new signal.

For example, the DAC 95 may convert a digital output signal received from the central controller 94 into an analog signal 110' that is sent to the sample-and-hold module 96. The analog signal may be an analog voltage output signal or an analog current output signal. The sample-and-hold module 96 may hold a voltage associated with the analog signal 110' in storage to drive some, or all, of the signal conditioning module 98. The DAC 95 would then be free to simultaneously drive other device elsewhere in the system 90.

The single input/output (I/O) interface of system 90 is a reconfigurable, bi-directional signal conditioning module 98. The signal conditioning module 98 receives an analog input signal and prepares that signal for use elsewhere in the system 90. Non-limiting examples of functions that may be performed by the signal conditioning module 98 include differential input amplification/attenuation, single ended input amplification/attenuation, filtering, anti-aliasing and various built-in-test (BIT) functions.

The function(s) being performed by the signal conditioning module 98 may be repeatedly changed in real time upon receiving appropriate configuration and timing control signals from the central controller 94 over a control bus 91. For example, at a first point in time the signal conditioning module 98 may be configured to receive a single-ended input from an active voltage source (e.g. a sensor) without invoking a built-in test function. After receiving the proper re-configuration inputs over the control bus 91, the very same signal conditioning module 98 may be re-configured in real time to provide a differential output with single-ended feedback, including a built-in test functionality. Each of the functions will be executed using common sets and sub-sets of electrical components but in different ways.

Figure 3:
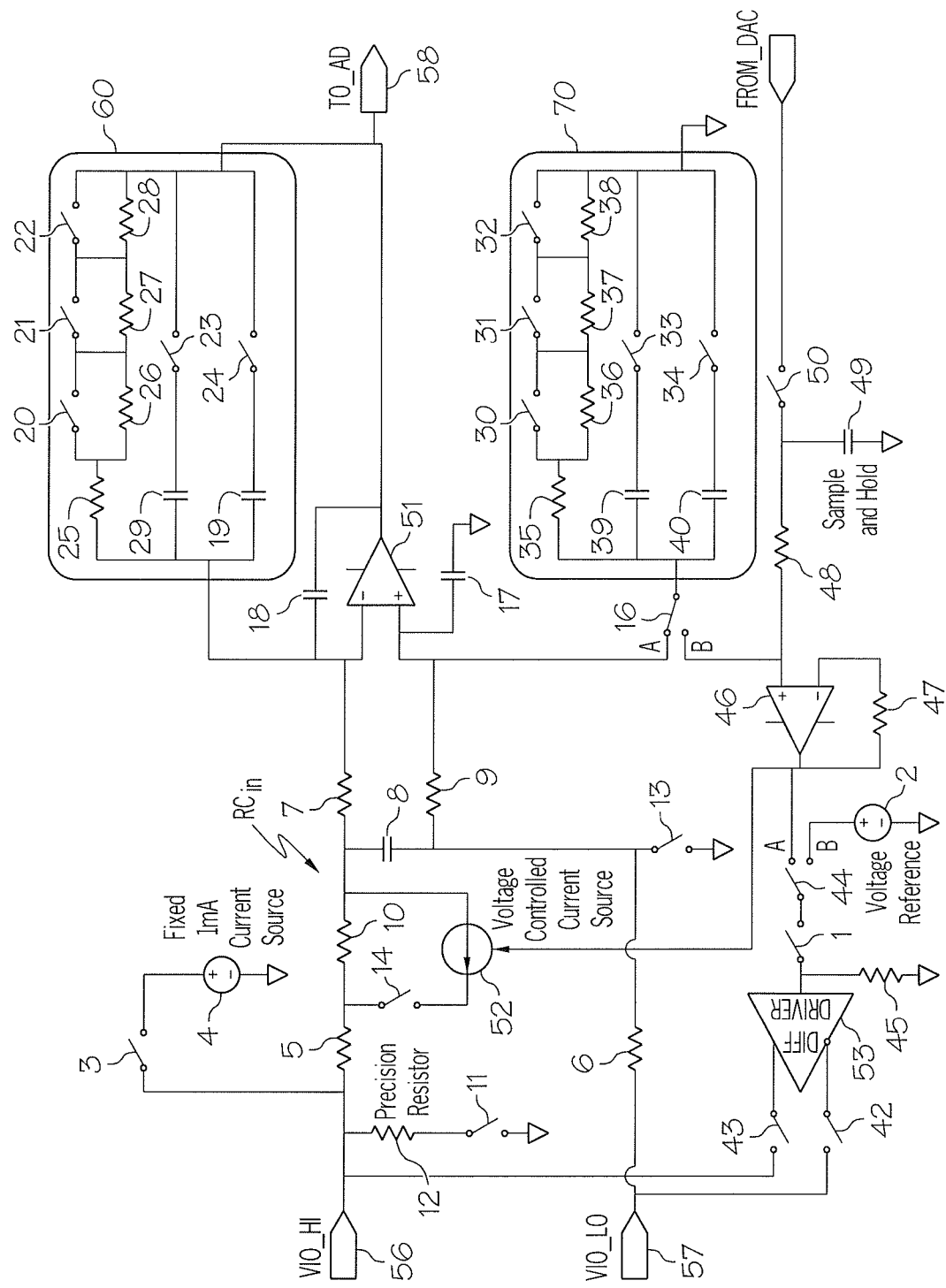
FIG. 3 is an simplified exemplary bi-directional signal conditioning circuit according to the subject matter disclosed herein.

FIG. 3 is an equivalent circuit diagram for an exemplary, non-limiting embodiment of the reconfigurable, bi-directional signal conditioning module 98 for conditioning signals into and out of system 90. The exemplary signal conditioning module 98 has one dedicated output pin 58, which may be the input to the A/D converter 93. Exemplary signal conditioning module 98 also has one dedicated input pin 59, which may be the input from the DAC 95. However, the number of dedicated input and output pins is merely exemplary for ease of explanation. Embodiments contemplated herein may include any number of any types of input and output pins as may satisfy a design requirement or a particular application.

Signal conditioning module 98 may also have two input/output pins VIOHi 56 and VIOLo 57, which may selectively serve as input pins to the input amplifier 51 or may serve as output pins from the signal conditioning module 98 to other systems or sensors. As a non-limiting example of pins 56 and 57 acting as an output, pins 56 and 57 may be used to drive an excitation voltage for an external sensor such as a linear variable differential transducer (LVDT). The voltage output on pins 56 and 57 may be a sine wave signal with 5 volts amplitude and 3000 Hz frequency that enables the LVDT to transduce position into electrical sine waves. The sine wave excitation voltage output would be driven by the differential driver 53. Alternatively, the signal output on pin 56 and 57 could be a DC voltage used by an external system to position a servo or display a physical parameter.

Signal conditioning module 98 may have one or more signal paths connecting pins VIOHi 56 and VIOLo 57 into the signal conditioning module 98. The exemplary signal path(s) depicted herein comprise a resistor-capacitor network RCin (resistors 5, 6, 7, 9, 10 and capacitor 8) which provides a signal path to the inverting and non-inverting input terminals of input amplifier 51. Resistors 5, 6, 7, 9, 10 typically are chosen to provide a high input impedance as viewed looking into pins VIOHi 56 and VIOLo 57. These impedances are typically greater than 10,000Ω. Resistors 5, 7, and 10 may have multiple functions as may be further described herein below.

In some embodiments, RCin may be a matched resistance network to maintain good common mode voltage rejection capability. In one embodiment, the resistance of the serial combination of resistors R5 and R10 may equal or approximate the resistance of resistor R6, and the resistance of resistor R7 may equal or approximate the resistance of resistor R9. Those of ordinary skill in the art will appreciate that capacitor C8 may serve to filter out high frequency noise from the incoming analog signal 110, the cut off frequency of which is determined by the resistance and capacitance values of the network RCin. RCin may also include inductive devices to satisfy a particular design requirement.

Input amplifier 51 may be any suitably configured amplifier capable of receiving and processing a single-ended and a differential input signal. Those of ordinary skill in the art will appreciate that capacitors 17 and 18 are matched capacitors in the low picofarad range that prevent self-resonance of the input amplifier 51 at high frequencies. Input amplifier 51 is used to amplify/attenuate and filter the analog input signal 110 and produce an output 58.

The gain and filtering control for the input amplifier 51 may include one or more configurable resistor-capacitor (RC) networks such as RC networks 60 and 70. RC networks 60 and 70 provide configurable gain and frequency filtering options for signal conditioning module 98. Impedance configuration switches (21-24 and 31-34) allow the gain and filter frequency to be adjusted. The central controller 94 may control the impedance configuration switches (21-24 and 31-34).

The exemplary impedance configuration switches 21-23 and 30-32 insert and remove their respective resistors 26-28 and 36-38 into and out of the RC networks 60 and 70 in order to control the gain of the input amplifier 51. Exemplary impedance configuration switches 23-24 and 33-34 insert and remove their respective capacitors 19, 29, 39 and 40 into and out of the RC networks 60 and 70 in order to control the filter frequency of RC networks 60 and 70.

The RC networks 60-70 presented herein are merely exemplary in nature. One of ordinary skill in the art will appreciate that any one of a multitude of alternative RC topologies and configurations for RC networks 60 and 70 may be chosen by one of ordinary skill in the art to satisfy a particular design requirement. It will also be appreciated that the RC networks 60 and 70 may also include inductive elements if a design requirement may so require.

One of ordinary skill in the art will also recognize that the impedance of RC network 60 may be matched by RC network 70 for proper performance of the input amplifier 51 when it is configured as a differential amplifier. The impedance of RC network 60 is configurable by switches 20-24 to be equal to or approximately equal to the impedance of RC network 70, which is configurable via the identically situated switches 30-34. RC networks 60 and 70 may be reconfigured independently or may be reconfigured in tandem.

Table 1 presents an exemplary, non-limiting set of selectable gain configurations for input amplifier 51 that may be achieved by opening the various impedance configuration switches 20-22 in the exemplary RC network 60. Because input amplifier 51 may be a differential amplifier where RC network 60 must be balanced by RC network 70, RC network 70 may be reconfigured simultaneously with RC network 60 such that RC network 60 mirrors the RC network 70. This may be accomplished by connecting corresponding impedance configuration switches (e.g. transistors) to a common input pin (e.g. See, FIG. 4).

TABLE 1

Exemplary Gain Equations for Input Amplifier 51 based on Switch Positions

| Gain | SW20 | SW21 | SW22 |
| --- | --- | --- | --- |
| 1 = R25/(R5 + R10 + R7) | closed | closed | closed |
| 2 = (R25 + R28)/(R5 + R10 + R7) | closed | closed | open |
| 3 = (R25 + R27)/(R5 + R10 + R7) | closed | open | closed |
| 4 = (R25 + R27 + R28)/(R5 + R10 + R7) | closed | open | open |
| 5 = (R25 + R26)/(R5 + R10 + R7) | open | closed | closed |
| 6 = (R25 + R26 + R28)/(R5 + R10 + R7) | open | closed | open |
| 7 = (R25 + R26 + R27)/(R5 + R10 + R7) | open | open | closed |
| 8 = (R28 + R26 + R27 + R28)/(R5 + R10 + R7) | open | open | open |

Input amplifier 51 has multiple functions depending on the configuration of signal conditioning module 98. In some embodiments, the input amplifier 51 may be a differential amplifier controlling the gain, phase and filtering of analog input signal 110 or 110' via RC networks 60 and 70. This configuration results when configuration switch 16 is in position "A" and configuration switch 13 is open.

In other embodiments, input amplifier 51 may be a single input amplifier (i.e. single-ended) with only RC network 60 connected as a feedback element. This mode is enabled when the configuration switch 16 is in position "B" and configuration switch 13 is closed.

In some embodiments, the signal conditioning module 98 may comprise a sample-and-hold sub-circuit 61. A simplified, exemplary sample and hold sub-circuit 61 may be comprised of capacitor 49 and switch 50. In operation, any voltage present at input pin 59 is applied to the capacitor 49 for a period of time that maybe referred to as a sample time $T_s$. When the switch 50 is subsequently opened, the voltage is "held" on capacitor 49 for a period of time that may be referred to as a hold time $T_h$. The sample-and-hold sub-circuit allows the DAC 95 driving it to provide signals to other devices in system 100 (not shown) while the sample voltage that is being held on capacitor 49 drives an operational amplifier 46.

Operational amplifier 46 may operate as a single input operational amplifier including a feedback loop with resistor 47 determining the gain (e.g. unity gain) when the configuration switch 16 is in the "A" position. Operational amplifier 46 receives and buffers the sample input stored in capacitor 49 via input resistor 48. The buffered amplifier output in turn may drive the voltage controlled current source and may drive differential driver 53. In some embodiments, operational amplifier 46 may be a differential input amplifier.

In some embodiments, various attenuation and filter options may be applied to operational amplifier 46 by configuring the RC network 70 independently of RC network 60. As discussed above, when configuration switch 16 is in the "B" position, the RC network 70 may be disconnected from the non-inverting terminal of input amplifier 51 and connected to the non-inverting terminal of operational amplifier 46, thereby controlling the attenuation and filtering of operational amplifier 46 in the same manner as discussed above in regard to the RC network 70.

In this configuration, the operational amplifier 46 may be used to provide a known DC or an alternating current ("AC") signal to a voltage controlled current source 52. When configuration switch 14 is closed, the voltage controlled current source 52 causes a known current that may be proportional or inversely proportional to the input from operational amplifier 46 to flow through resistor 10. This current is in addition to any current flowing due to any input signal 110/110' at pin $VIO_{Hi}$ 56. The additional current source causes an increase in the voltage across the resistor 10 and thereby causes an incremental voltage to be reflected into input amplifier 51 across capacitor 8. The known incremental voltage across capacitor 8 allows a BIT function to be executed by the central controller 94 to verify the operation and the configuration of various components of signal conditioning module 98. For example, by applying a step change in voltage across resistor 10 and measuring the change in the output of input amplifier 51, it is possible to verify the operation of input amplifier 51.

As another example, a stepwise linear approximation of a sine wave delivered from the sample-and-hold sub-circuit 61 may be injected into the input amplifier 51 via resistor 10. The RC network 70 may be reconfigured to filter out the high frequency noise component of the stepwise linear approximation of a sine wave signal. By measuring the resulting output signal of the input amplifier 51, the filter time constant of the input amplifier stage can be verified by the central controller 94.

Differential driver 53 is an operational amplifier that may have a single input and multiple outputs. In the exemplary configuration of FIG. 1, differential driver 53 has two outputs with equal and opposite polarity. Differential driver 53 may receive a positive +2 Vdc input from sample-and-hold subcircuit. The differential driver 53 then may produce a positive +2 Vdc from a first output terminal associated with configuration switch 43 and a negative −2 Vdc from an inverted output terminal associated with configuration switch 42. In this example the differential driver 53 chosen has a gain of 2. These outputs from differential driver 53 may then be connected to pin $VIO_{Hi}$ 56 and pin $VIO_{Lo}$ 57 as BIT inputs to the signal conditioning module 98 or as outputs to external devices.

The signal conditioning module 98 may also comprise a fixed current source 4 that is switchably coupled to the $VIO_{Hi}$ input of the input amplifier 51. The fixed current source 4 may be adjustable to generate any number of fixed current source values. As a non-limiting example, the fixed current source 4 may drive a constant 1.0 mA current. The fixed current source 4 may then be used to drive a passive element R connected between $VIO_{Hi}$ and $VIO_{Lo}$ to determine the status thereof. Element R may be a resistive temperature device (RTD).

For example, a RTD that is connected across the pins $VIO_{Hi}$ 56 and $VIO_{Lo}$ 57 may be exposed in an environment, the temperature of which is to be measured. Because an RTD is a temperature sensitive resistor, it has no power source to generate a voltage that may be detected by the signal conditioning module 98. To read the RTD, a known current may be directed from the fixed current source 4 through the RTD via pin $VIO_{Hi}$ and back to the signal conditioning module 98 via pin $VIO_{Lo}$. The IR voltage drop created in the RTD, like other voltages that may be presented across pins $VIO_{Hi}$ 56 and $VIO_{Lo}$ 57, will be reflected across the capacitor 8 to input amplifier 51 for further evaluation by central controller 94.

The signal conditioning module 98 may also include a 4-20 mA current loop for interfacing with a variety of external 4-20 mA sensors. A non-limiting list of exemplary 4-20 mA sensors includes acoustic microphones, accelerometers, rate sensors, differential strain gages, thermocouples, flow sensors, pressure sensors, temperature sensors, radiometers, and the like. A current loop is a method of transmitting information from active sensor over relatively long distances.

The 4-20 mA current loop, as incorporated herein, may comprise the reference voltage 2 (i.e. a power supply), the differential driver 53, a sensor connected between the $VIO_{Hi}$ and $VIO_{Lo}$ the input amplifier 51 and the input paths thereto. The input amplifier acts as the receiver of the sensor data.

When configuration switches 1 and 11 are closed and configuration switch 44 is in the "B" position, a reference voltage 2 drives the differential driver 53. The differential driver 53 receives the reference voltage and outputs a predetermined voltage to the 4-20 mA sensor D at $VIO_{Lo}$. The sensor returns a current proportional to the physical parameter being measured. This returning current creates a voltage across precision resistor 12 thereby inducing a voltage across capacitor 8 as an input to the input amplifier 51 for further analysis by central controller 94

At the 4-20 mA sensor, the physical parameter transduced by the sensor is converted to a proportional current. A 4 mA current normally represents the sensor's zero-level voltage output and 20 mA current represents the sensor's full-scale voltage output. Configuration switch 11 is closed to allow the signal current to flow through pin $VIO_{Hi}$ and precision resistor 12 to ground. The 4-20 mA current signal then flows back to the signal conditioning module 98 and is converted into a voltage signal when the current signal passes through precision resistor 12 to ground. Like the other voltages that may be presented across pins $VIO_{Hi}$ and $VIO_{Lo}$, the voltage across precision resistor 12 is conditioned by the input amplifier 51 and by input paths $RC_{in}$. Specifically, the returning current induces a proportional voltage signal across precision resistor 12 thereby inducing a voltage across C8 as an input to the input amplifier 51 for further analysis by central controller 94.

As discussed above, the signal condition module 98 is reconfigurable in real time to accomplish nearly simultaneously a number of functions utilizing the same components but in different topologies. This is done by utilizing a switch fabric. The switch fabric is a plurality if switching mechanisms strategically placed at various points in the conditioning module 98 and configured to switch in, switch out and thereby re-combining different circuit elements.

The exemplary signal conditioning module 98 includes an exemplary switch fabric that comprises configuration switches 1, 3, 11, 13, 14, 16, 42, 43 and 45 and also comprises the impedance configuration switches 20-24 and 30-34. It should be reiterated that FIG. 3 is an exemplary equivalent circuit for the signal conditioning module 98. The actual structure of signal conditioning module 98 may be implemented using a number of alternative topologies, alternative electronic devices and alternative switch locations without departing from the scope of the subject matter disclosed herein.

Figure 4:
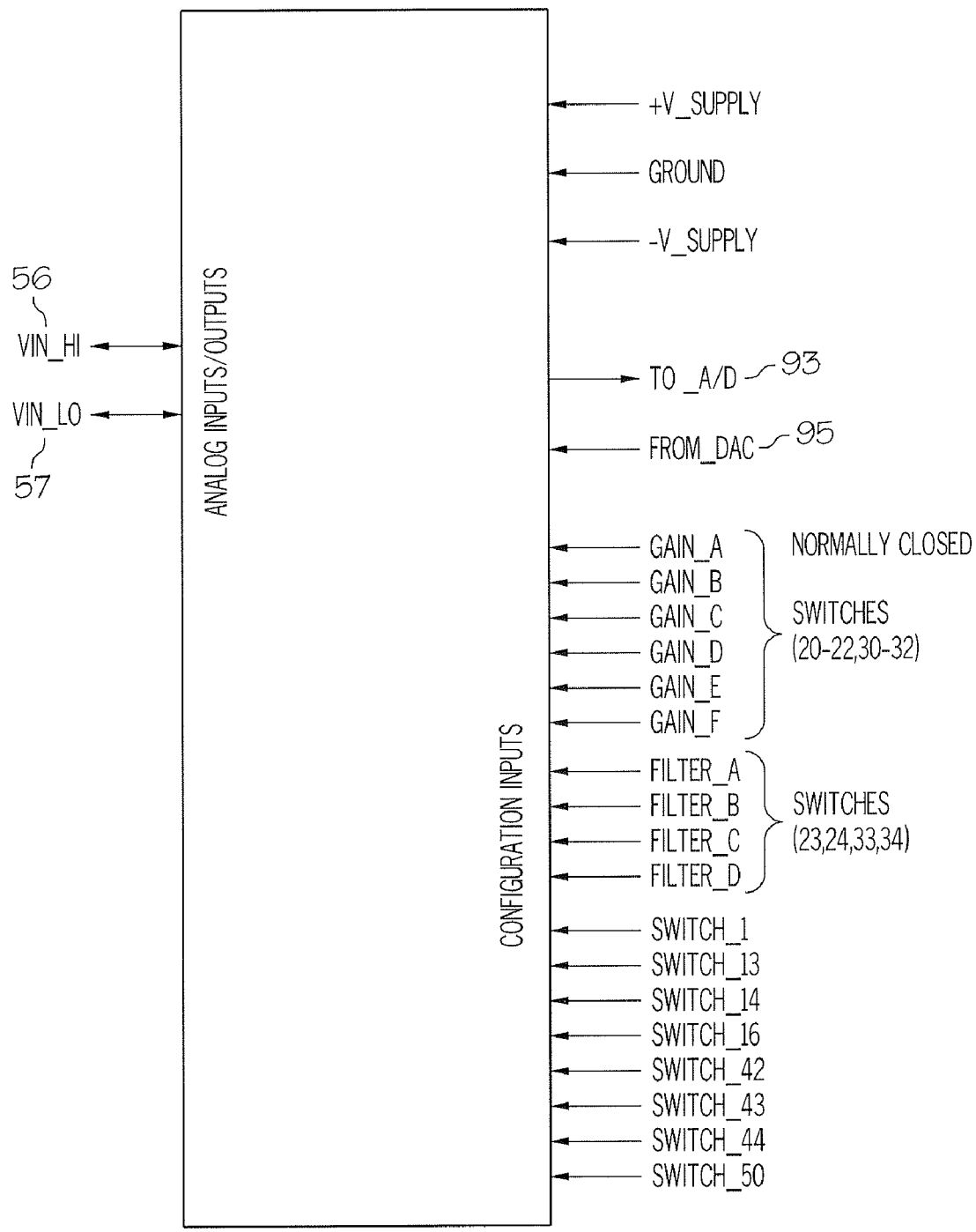
FIG. 4 is a block diagram depicting an exemplary pin out for the exemplary bi-directional signal conditioning circuit of FIG. 3.

As a non-limiting example and discussed herein in the interest of simplicity and clarity, the signal conditioning module 98 may be implemented as an application-specific integrated circuit (ASIC) on a single chip. Therefore, the switch fabric may be controlled by energizing or de-energizing one or more input pins on the ASIC. As an example, FIG. 4 is a simplified and exemplary pin out diagram for an exemplary ASIC containing the signal conditioning module 98.

In some embodiments, the state of the switch fabric may be driven from within the ASIC by means of memory cells, often also referred to as registers or flip-flops (not shown). These memory cells could be writable and readable by means of address, data and control signals as is common in memory circuits. The outputs of these memory cells could then drive the switches to their intended states. In some embodiments the outputs of these memory cells would drive the configuration inputs shown in FIG. 4.

Table 2 is a modality table that relates some exemplary functionalities of the signal conditioning module 98 to the condition of the switch fabric thereof. Table 2 addresses only the positioning of the configuration switches 1, 3, 11, 13, 14, 16, 42, 43 and 44. Impedance configuration switches 20-24 and 30-34 reconfigure the RC networks 60 and 70 as desired in conjunction with any combination of the configuration switches. As such, switches 20-24 and 30-34 will not be addressed here. Similarly, the position of switch 50 connecting the DAC 95 to the signal conditioning circuit is always considered to be closed for the examples discussed herein below. Switch 50 is used to implement the sample and hold function on capacitor 49 and will not be considered as a configuration switch.

TABLE 2

Re-Configurable Signal Conditioning Circuit Modalities

| FIG. # | Exemplary Mode (Describes Input Signal Source or Output Signal) | Switch number (from FIG. 3) | | | | | | | |
|---|---|---|---|---|---|---|---|---|---|
| | | 1 | 3 | 11 | 13 | 14 | 16 | 43 | 42 | 44 |
| 5 | Differential Input, Active Voltage source, No BIT | O | O | O | O | O | A | O | O | X |
| 6 | Differential Input, Passive Sensor Source, No BIT | O | C | O | O | O | A | O | O | X |
| 7 | Differential Input, Active Voltage Source, with BIT | O | O | O | O | C | A | O | O | A |
| 8 | Differential Input, Passive Sensor source, with BIT | O | C | O | O | C | A | O | O | X |
| 9 | Single Ended Input, Active Voltage Source, No BIT | O | O | O | C | O | B | O | C | X |
| 10 | Single Ended Input, Passive Sensor Source, No BIT | O | C | O | C | O | B | O | C | X |
| 10a | Single Ended Input, Passive Source, U53 BIT | C | O | O | C | O | B | C | C | A |
| 11 | Single Ended Input, Active Voltage Source, + BIT | O | O | O | C | C | B | O | C | X |
| 12 | Single Ended Input, Passive Sensor Source, + BIT | O | C | O | C | C | B | O | C | X |
| 13 | Differential Output with Differential feedback BIT | C | O | O | O | O | A | C | C | A |
| 14 | Differential Output with Diff FB & injection BIT | C | O | O | O | C | A | C | C | A |
| 15 | Single Ended Output with Single Ended FB BIT | C | O | O | C | O | B | C | O | A |
| 16 | 4-20 mA input, no injection BIT | C | O | C | C | O | B | O | C | B |
| 17 | 4-20 mA input, with injection BIT | C | O | C | C | C | B | O | C | B |
| Mode | | 1 | 3 | 11 | 13 | 14 | 16 | 43 | 42 | 44 |
| | (Describes Input Signal Source or Output Signal) | Switch number (from FIG. 3) | | | | | | | | |

O = Open; C = Closed; X = Either

Figure 5:
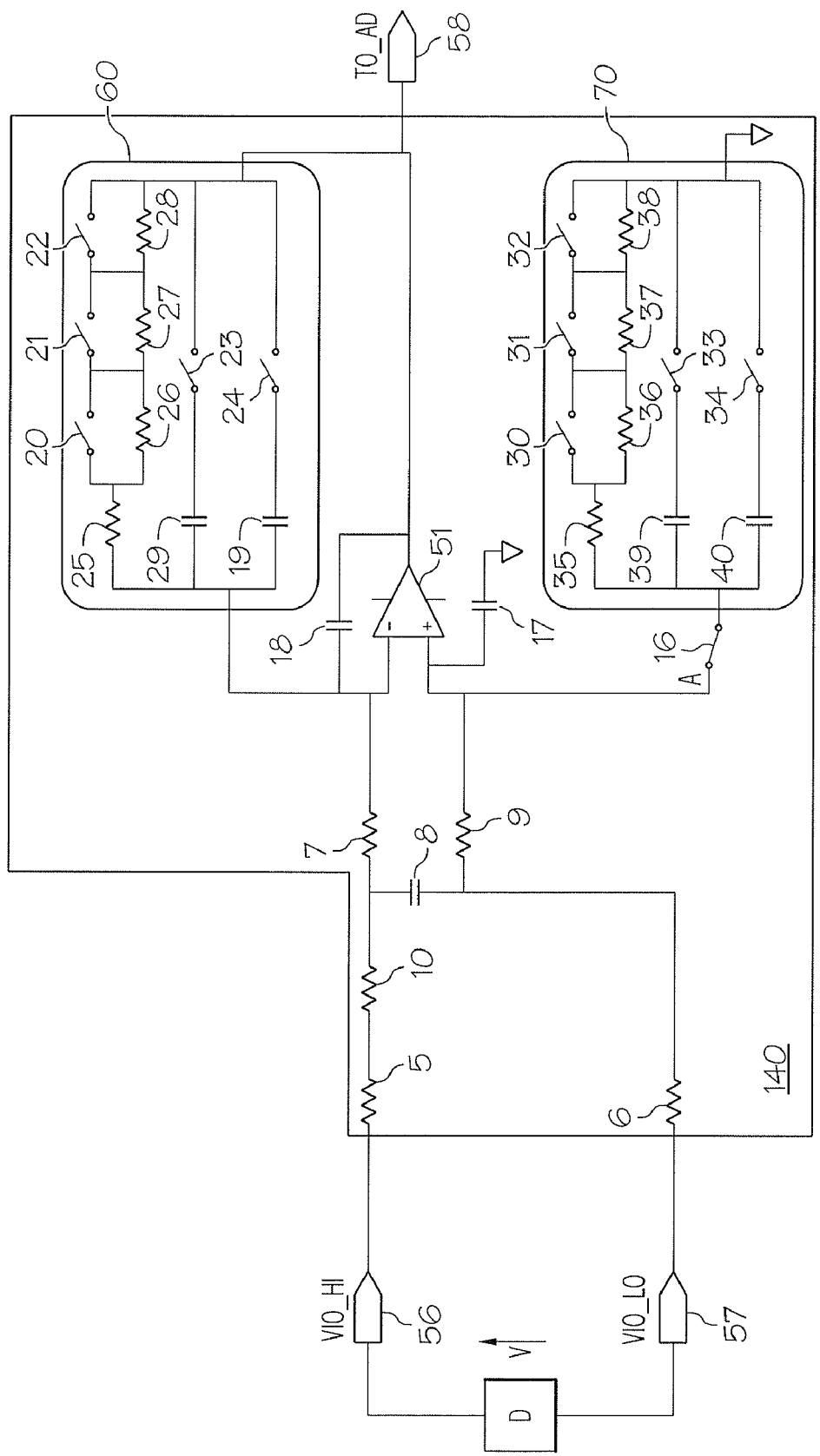
FIG. 5 illustrates an embodiment of the exemplary bi-directional signal conditioning circuit of FIG. 3 in a differential input, active voltage source configuration.

The modality of FIG. 5 illustrates an exemplary embodiment that accepts a differential voltage input across the input terminals $VIO_{Hi}$ and $VIO_{Lo}$. The embodiment of FIG. 5 with input amplifier 51 at its center equates to an input amplifier stage. It includes the input resistor/capacitor network RCin, the input amplifier 51, the stabilizing capacitors 18 and 19, and the configurable RC networks 60 and 70. This combination of components will be referred to hereinafter as the input amplifier stage 140. The differential voltage input across the input terminals is conditioned by the input amplifier stage 140 for input to the AD converter 93 for analysis by central controller 94. The modality of FIG. 5 results when the configuration switches 1, 3, 11, 13, 14, 42 and 42 are open and configuration switch 16 is in the "A" position.

In FIG. 5, the input amplifier 51 is being operated as a differential amplifier. It is preferred that the RC networks 60 and 70 be similarly, if not identically configured, to maintain high common mode voltage rejection and predictable gain from input amplifier 51. As discussed above, the gain and frequency of the RC networks 60 and 70 are determined by energizing or de-energizing one or more of pins Gain A, Gain B, Gain C, Gain D, Gain E and Gain F as illustrated in FIG. 4.

For the sake of clarity it will be assumed that each of the impedance configuration switches 20-22 and 30-32 are normally de-energized closed and each of impedance configuration switches 23-24 and 33-34 are normally energized open. However, one of ordinary skill in the art will recognized that the switches 20-24 and 30-34 may be normally energized open or may be designed in some other normal state as may be found convenient by an artisan for a specific purpose.

By de-energizing open any or all of the pins Gain A-F, a resistor 26-28 and/or 36-38 may be added to the RC network(s) 60 and 70 thereby changing the gain of the input amplifier 51. Similarly by de-energizing closed the one or more impedance switches 23, 24, 33 and 34, the shoulder frequency of the single pole, low pass filter created by RC networks 60 and 70 may be changed.

It should also be noted that configuration switches 1, 3 and 14 are normally de-energized open. These open switch positions remove the operational amplifier 46, the reference voltage 2, the 1.0 mA fixed current source 4 and the voltage controlled current source 52 from the signal conditioning module 98. As such, no BIT signal can be applied to the input amplifier 51.

Figure 6:
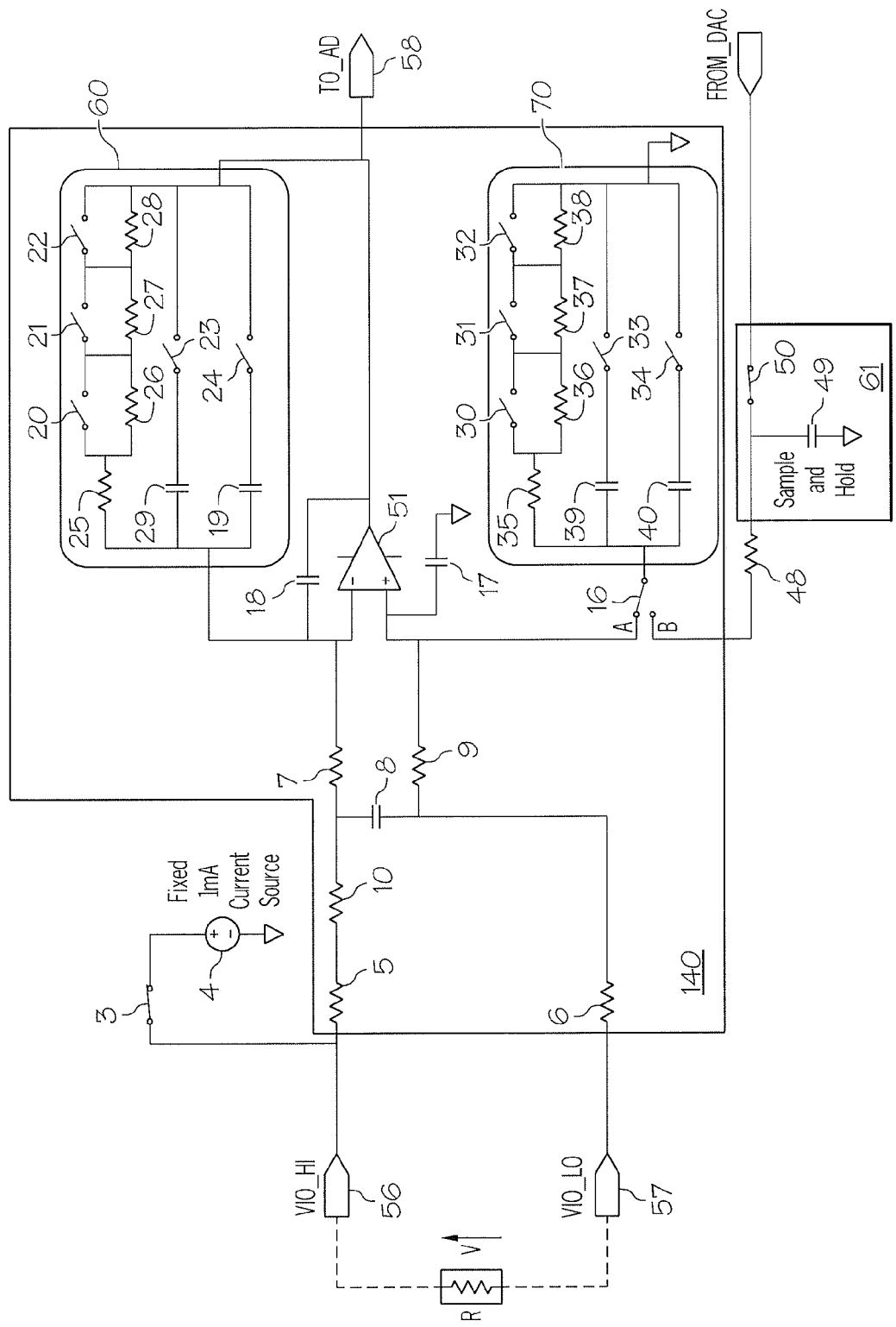
FIG. 6 illustrates an embodiment of the exemplary bi-directional signal conditioning circuit of FIG. 3 in a differential input, passive sensor configuration.

The modality of FIG. 6 illustrates an exemplary embodiment that injects a current source through a passive device R that is connected across $VIO_{Lo}$ and $VIO_{Hi}$. When configuration switch 3 is shut, the current from the fixed current source 4 passes through the passive element R and produces a voltage V across the input terminals. The differential voltage input across the input terminals is conditioned by the input amplifier stage 140 for input to the AD converter 93 and for analysis by central controller 94. Input amplifier 51 is being used here to implement a second purpose which is to read a passive sensing device R.

Figure 7:
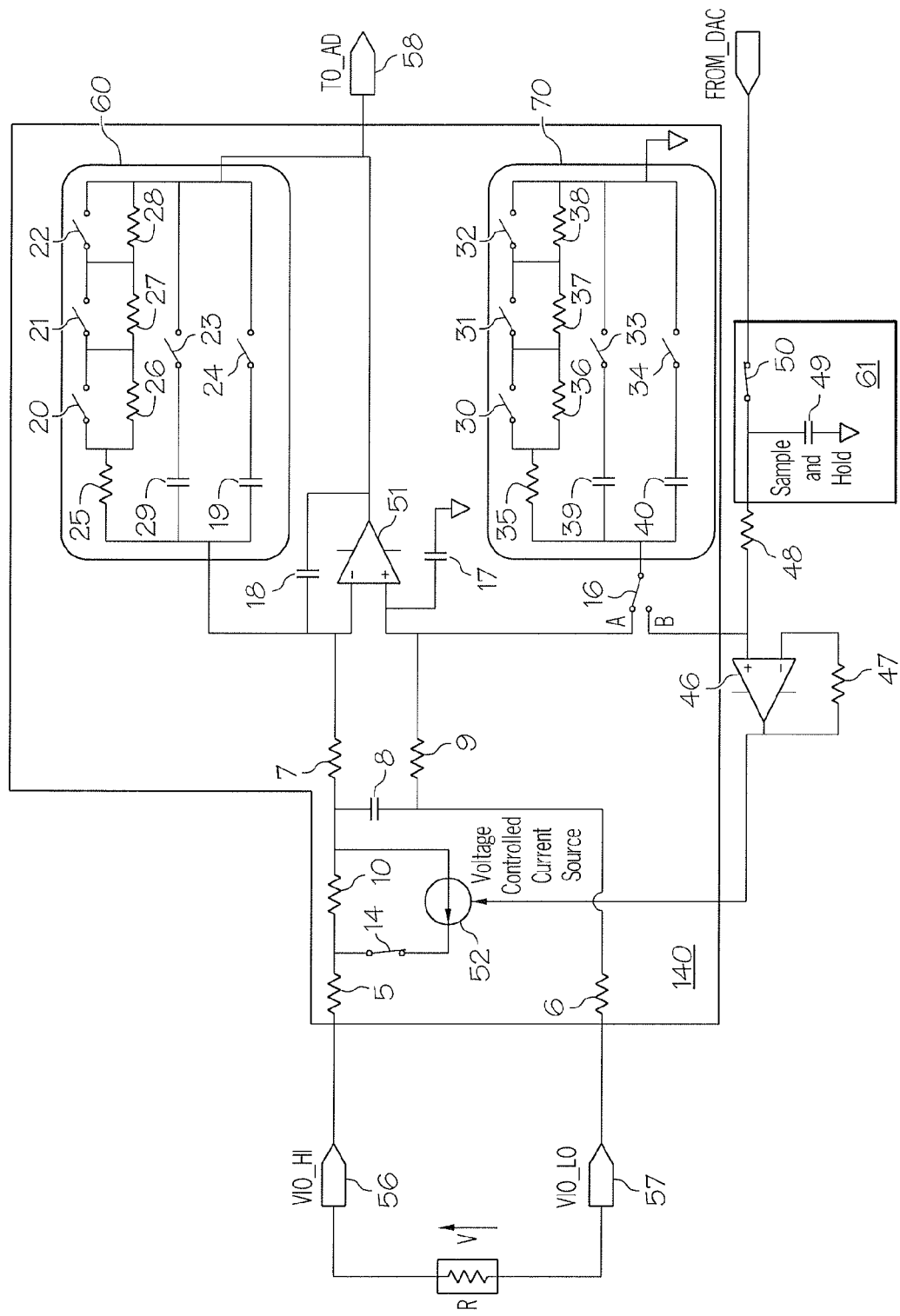
FIG. 7 illustrates an embodiment of the exemplary bi-directional signal conditioning circuit of FIG. 3 in a differential input, active voltage source operational configuration with BIT.

The modality of FIG. 7 illustrates another exemplary embodiment that both receives a differential input from an outside voltage source V into the input amplifier via pins $VIO_{Lo}$ and $VIO_{Hi}$ and also receives a BIT signal resulting from the voltage controlled current source 52 being injected through resistor 10. By closing configuration switch 14, output voltage from the operational amplifier 46 can be applied to the voltage controlled current source 52 which injects a predetermine current through resistor 10 that is a linear function of the voltage out of operational amplifier 46. The voltage created across resistor 10 is seen as an offset by the input amplifier stage 140. This offset can then be verified by the central controller 94 after the resulting voltage is converted by the AD Converter 93. This modality is a BIT modality to verify the configuration and operation of the input amplifier stage 140. The modality of FIG. 7 may be used intermittently with the modality of FIG. 5 during regular operation of the circuit for real time operational verification. For example, the signal conditioning module 98 can be configured in mode 7 for every $100^{th}$ AD conversion of the signal conditioning module output at pin 59 thereby verifying its operation and configuration without a significant loss of data from the external input signal 110. It will be apparent to those skilled in the art that any number of modalities or combinations thereof may be programmed in a serial fashion to accomplish multiple tasks virtually simultaneously.

Figure 8:
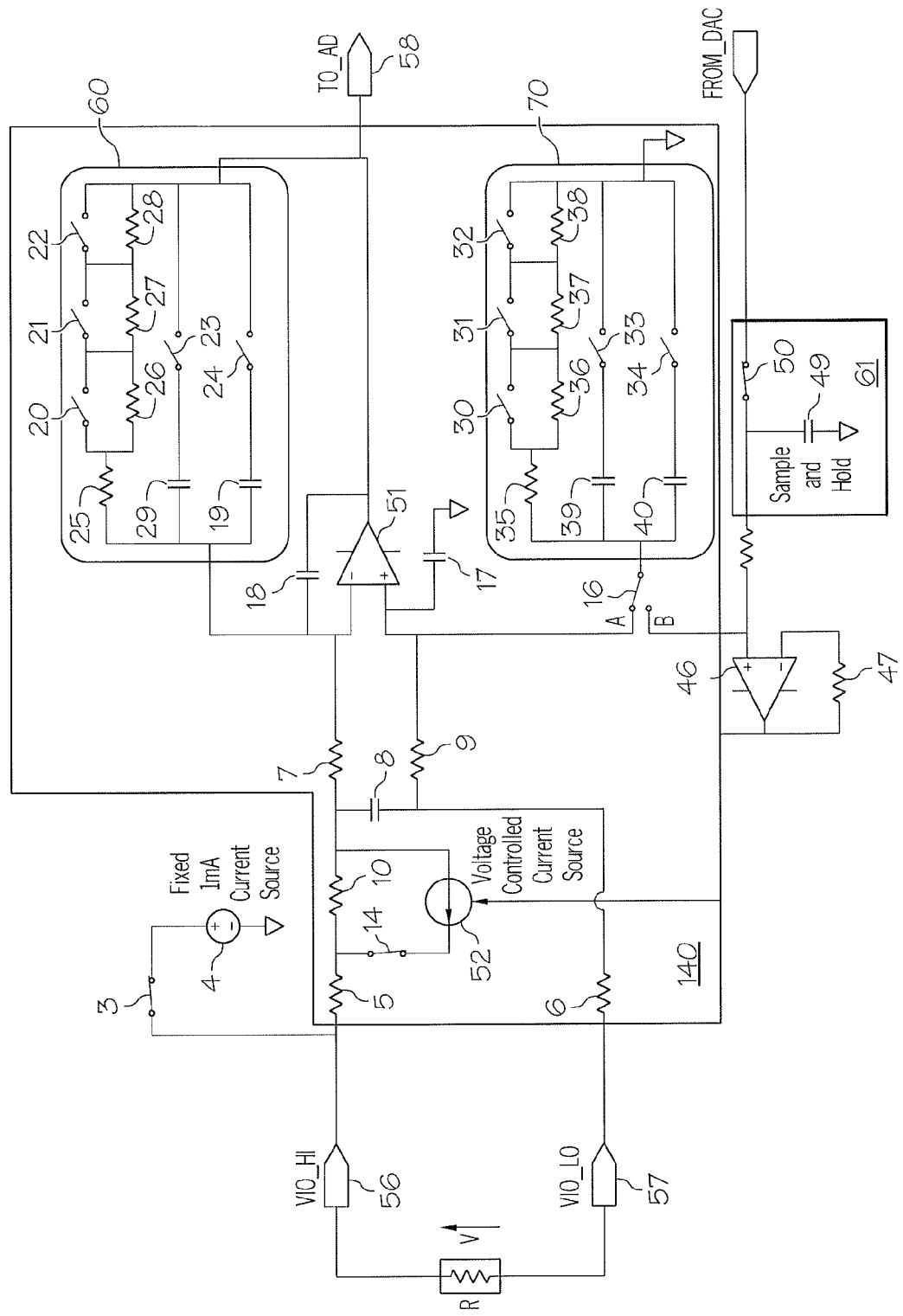
FIG. 8 illustrates is an embodiment of the exemplary bi-directional signal conditioning circuit of FIG. 3 in a differential input, passive sensor operational configuration with BIT.

The modality of FIG. 8 illustrates another exemplary embodiment. This mode is similar to the modality of FIG. 6 except that configuration switch 14 is closed to add BIT functionality. Similar to the modality of FIG. 7, the voltage controlled current source 52 is used to inject an offset voltage into the input amplifier stage 140. This offset can then be verified by the central controller 94 after the resulting voltage is converted by the AD Converter 93. This modality is a BIT modality that verifies the configuration and operation of the input amplifier stage 140. The modality of FIG. 8 may be used intermittently with the modality of FIG. 6 during regular operation of the circuit for real time operational verification. For example, the modality of FIG. 8 can be configured for every 100$^{th}$ AD conversion of the signal conditioning module 98 output thereby verifying operation and configuration without a significant loss of data from the external input signal. As such, the input amplifier 51 and RC networks 60 and 70 may be tested for proper operation without a significant loss of data.

Figure 9:
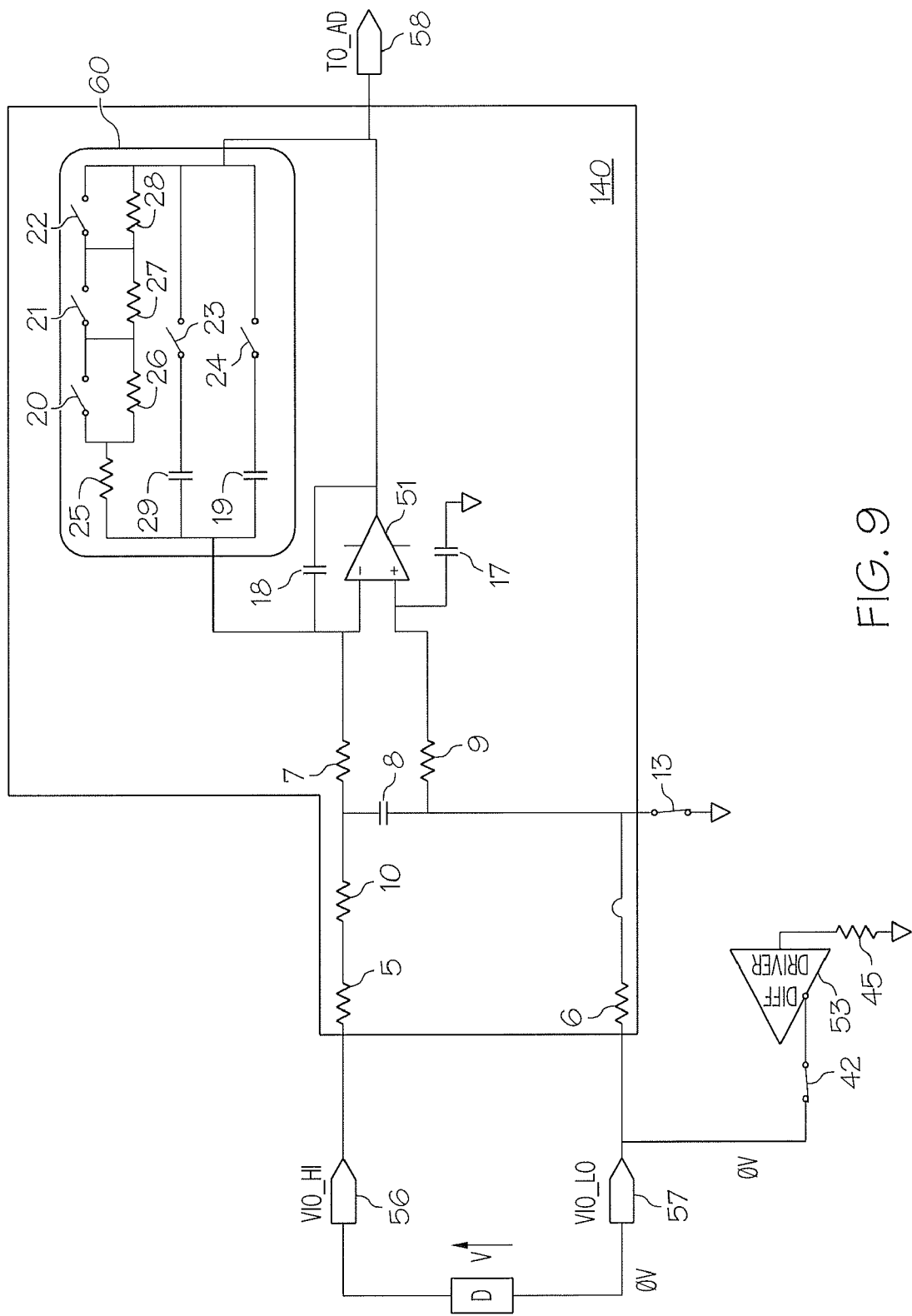
FIG. 9 illustrates an embodiment of the exemplary bi-directional signal conditioning circuit of FIG. 3 in a single-ended input, active voltage source configuration.

The modality of FIG. 9 illustrates another exemplary embodiment that receives a single-ended input voltage V from an active device D into the input amplifier at VIO$_{Hi}$ By closing configuration switch 42, VIO$_{Lo}$ is driven to zero volts (i.e. a virtual ground) such that the active device D is also virtually connected to ground. The active device D is shown connected across the input pins VIO$_{Hi}$ 56 and VIO$_{Lo}$ 57. However, this device could achieve its ground connection by use of chassis grounds or signal grounds other than Vio$_{la}$. It is a feature of various embodiments that single-ended input modes include this virtual ground connection. Closing configuration switch 13 connects the non-inverting input terminal of input amplifier 51 to ground through resistor R9. Opening configuration switches 1 and 14 isolates the output of operational amplifier 46 from the differential driver 53. Placing configuration switch 16 in the "B" position disconnects the RC network 70 from input amplifier 51.

The voltage input on VIO$_{Hi}$ from active device D is conditioned by the input amplifier stage 140 which has been configured for single-ended operation. The conditioned voltage is input to the AD converter 93 and is made available for further processing by the central controller 94.

Figure 10:
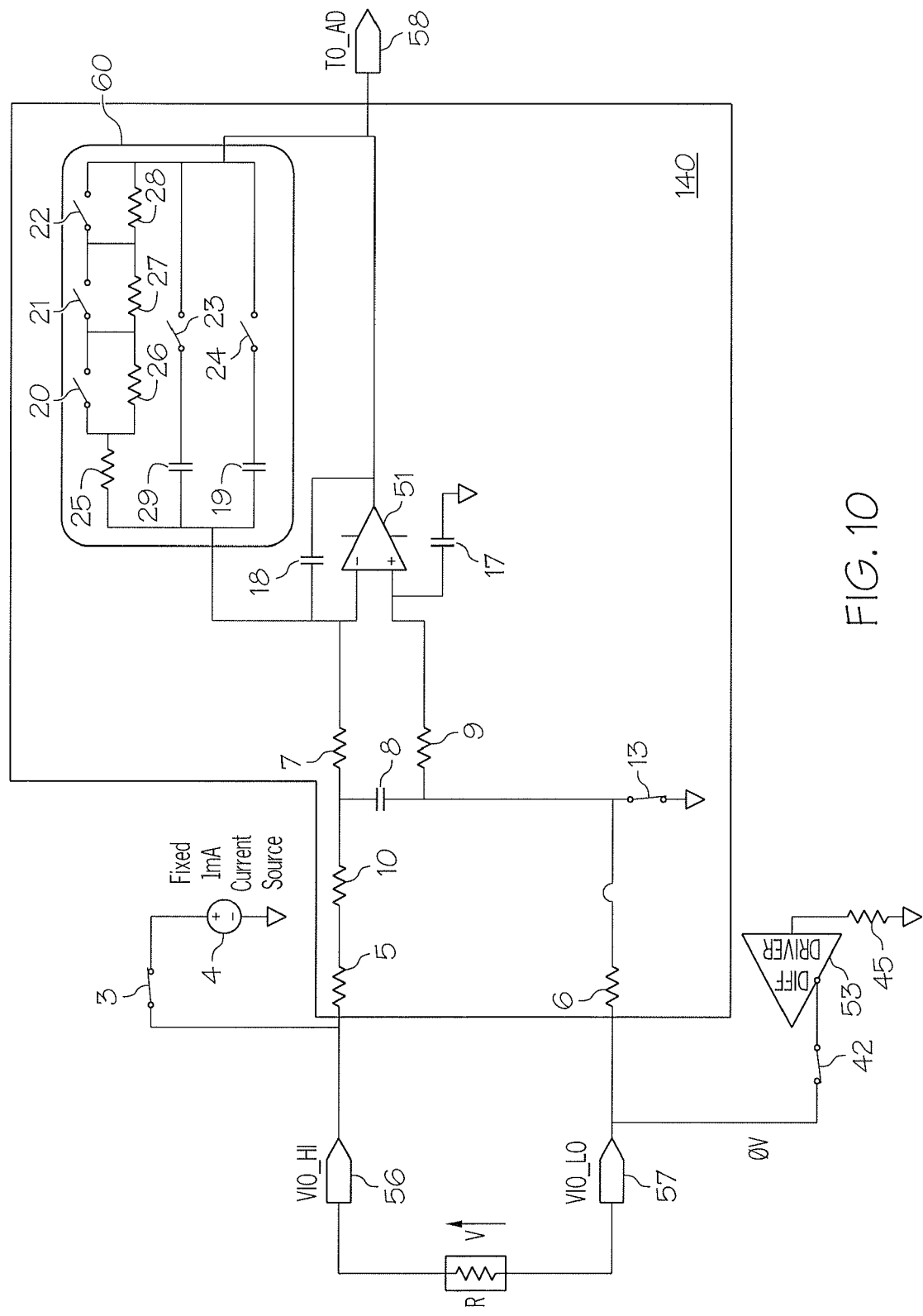
FIG. 10 illustrates an embodiment of the exemplary bi-directional signal conditioning circuit of FIG. 3 in a single-ended input, passive sensor configuration.

The modality of FIG. 10 illustrates another exemplary embodiment where a passive element R replaces the active voltage source D illustrated in the exemplary embodiment of FIG. 9. The exemplary embodiment of FIG. 10 configures the input amplifier stage 140 for single-ended operation. Configuration switch 3 is closed to allow the fixed current source 4 to supply a fixed current (i.e. 1 mA) to the external passive element R connected to terminal pins VIO$_{Hi}$ and VIO$_{Lo}$. The fixed current creates a voltage at VIO$_{Hi}$. This voltage is conditioned by the input amplifier stage 140 for input to the AD converter 93 and for analysis by central controller 94.

Figure 10A:
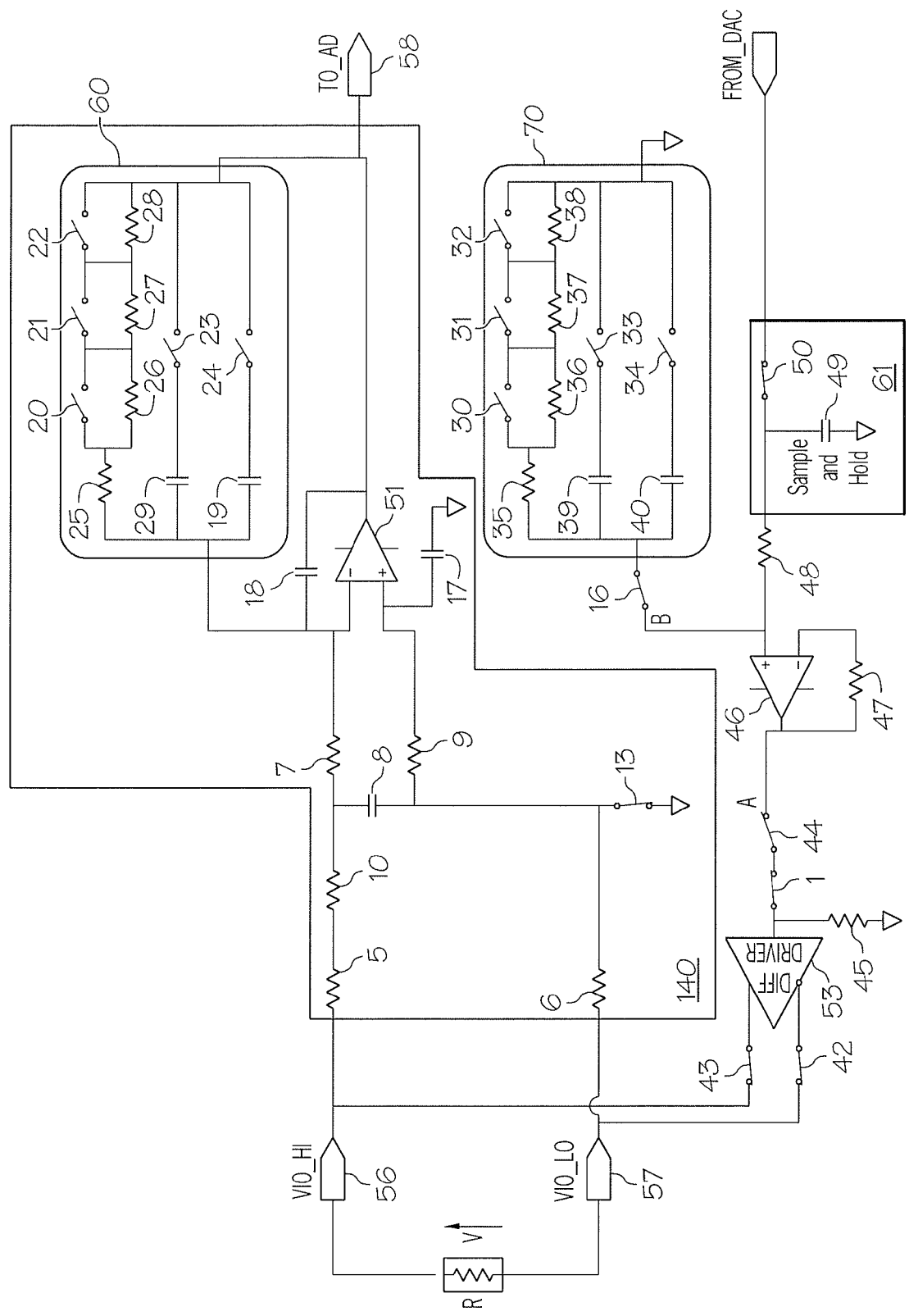
FIG. 10a illustrates an embodiment of the exemplary bi-directional signal conditioning circuit of FIG. 3 in a single-ended input, passive sensor configuration with an output feedback BIT.

The modality of FIG. 10a illustrates another exemplary embodiment that features a second BIT voltage that is driven by differential driver 53. The exemplary embodiment of FIG. 10A momentarily deviates from the modality of FIG. 10 and overdrives the voltage at VIO$_{Hi}$ by closing configuration switch 1, closing configuration switch 43 and placing configuration switch 44 in the "A" position.

Placing configuration switch 16 in the "B" position connects in the RC circuit 70 to the non-inverting input of the operational amplifier 46. The RC network 70 may attenuate and filter the BIT signal being transmitted from the DAC 95 via the sample-and-hold sub-circuit 61. The RC network 70 can filter out ripple and other noise from the piece-wise linear signal BIT from the DAC 95 and the sample-and-hold 96. In this configuration a variety of AC and DC signals can be applied to the input amplifier stage 140 to verify that the intended signal conditioning is functioning as configured.

For example, a stepwise linear approximation to a sine wave of frequency 10 Hz could be generated through the path that includes the DAC 115, the sample-and-hold 116, the operational amplifier 46, configuration switches 44 (position A) and 1 (closed), differential driver 53 and configuration switches 42 (closed) and 43 (closed). A sequence of AD conversions can be processed by the central controller 94 to determine if the signal presented to the AD converter is filtered and amplified/attenuated as intended by the configuration of the input amplifier stage. Thereafter, the test signal applied by the same path could be changed to a higher frequency sine wave of, for example 10,000 Hz. If the input amplifier stage 140 is configured to filter the signal with a 100 Hz low pass impedance configuration then the resulting signal out of the input amplifier stage 140 will be appropriately attenuated by the filter. This will be apparent by analyzing the string of AD conversions in the central controller 94. If the attenuation of the 10,000 Hz signal does not occur then a filter failure is detected by the BIT.

Figure 11:
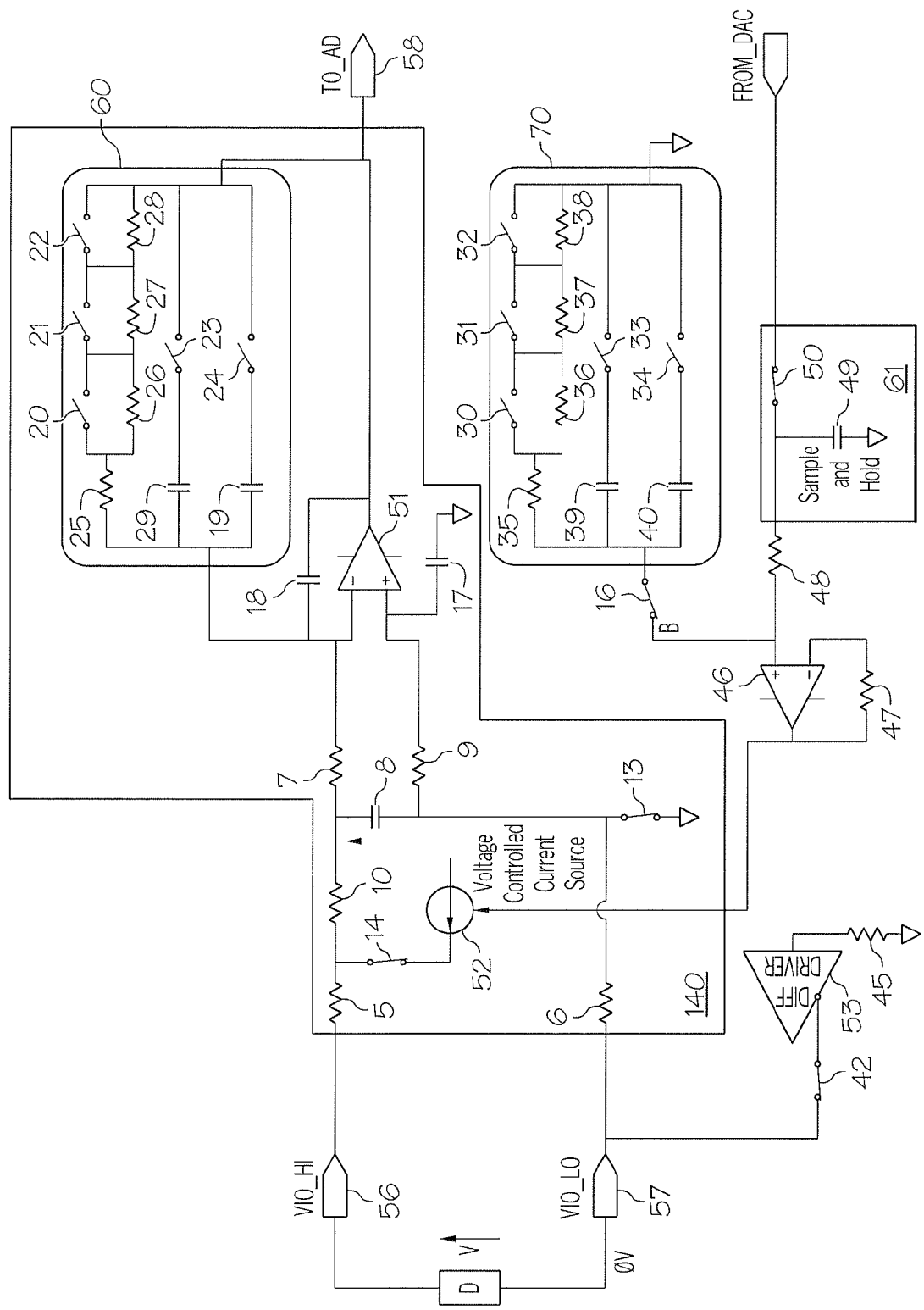
FIG. 11 illustrates an embodiment of the exemplary bi-directional signal conditioning circuit of FIG. 3 in a single-ended input, active voltage source configuration with feedback BIT.

The modality of FIG. 11 illustrates another exemplary embodiment that receives a single-ended input from active component D and simultaneously provides a BIT capability. Because configuration switch 16 is in the "B" position, the signal input at pin 59 from the DAC 95 is filtered by RC network 70 to remove ripple or other noise from a test signal before it is processed by operational amplifier 46 and used to initiate a BIT. The BIT is accomplished by using the voltage controlled current source 52, as discussed above with respect to modalities of FIGS. 6 and 8. The closure of configuration switch 13 couples the non-inverting input of input amplifier 51 to ground. Closing configuration switch 42 connects the VIOLo to a virtual ground for use by the active external device D.

Figure 12:
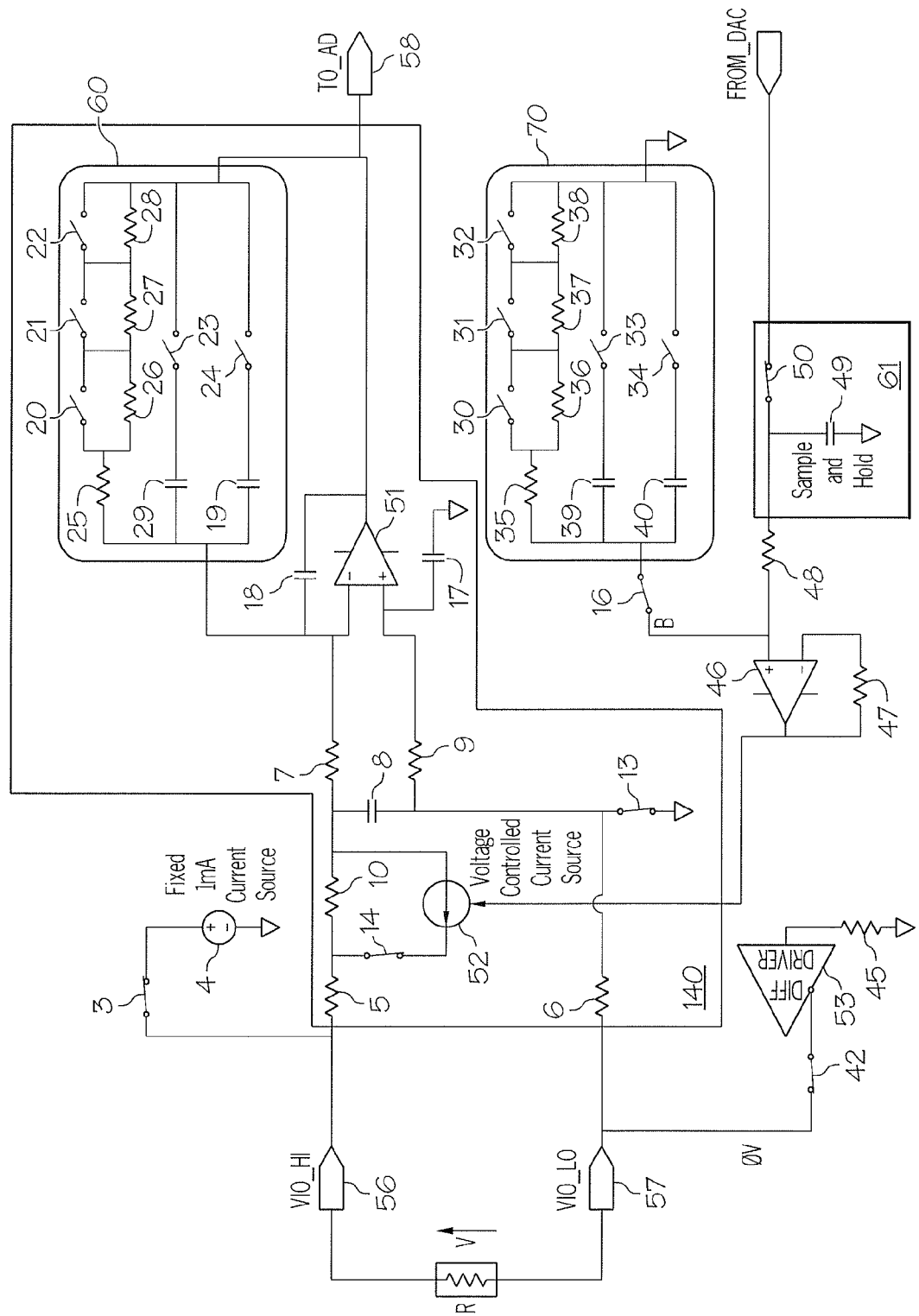
FIG. 12 illustrates an embodiment of the exemplary bi-directional signal conditioning circuit of FIG. 3 in a single-ended, Passive sensor configuration with feedback BIT.

The modality of FIG. 12 illustrates another exemplary embodiment that queries a passive device R. Closing configuration switch 42 couples the VIOLo to virtual ground and thereby couples the passive external device R to ground as well allowing the fixed current source 4 to flow through passive resistor R. Input amplifier 51 is converted to a single ended amplifier because the non-inverting input is also connected to ground by closing configuration switch 13. In operation, a voltage V is induced across the passive device R by the fixed current source 4. This voltage is conditioned by the input amplifier stage 140 for input to the AD converter 93 and for analysis by central controller 94 via input pin 59.

The modality of FIG. 12 also includes a BIT capability to test input amplifier 51 and RC network 60. Placing configuration switch 16 in the "B" position connects the RC network 70 to the non-inverting input of the operational amplifier 46 to allow attenuation and filtering of a BIT signal received from the central controller 94.

By closing configuration switch 14, the output voltage from operational amplifier 46 injects a known incremental current through resistor 10, which is reflected across capacitor 8 as an incremental input to the input amplifier 51. The incremental input is amplified/attenuated and filtered for further processing by the central controller 94. The central controller 94 uses the incremental output received from input amplifier 51 to verify the proper operation of the input amplifier and other components of the signal conditioning module 98. The closing of configuration switches 42 and 13 connect the passive element R and the non-inverting terminal of input amplifier 51 to a virtual ground thereby shifting the signal conditioning circuit to single ended input.

Figure 13:
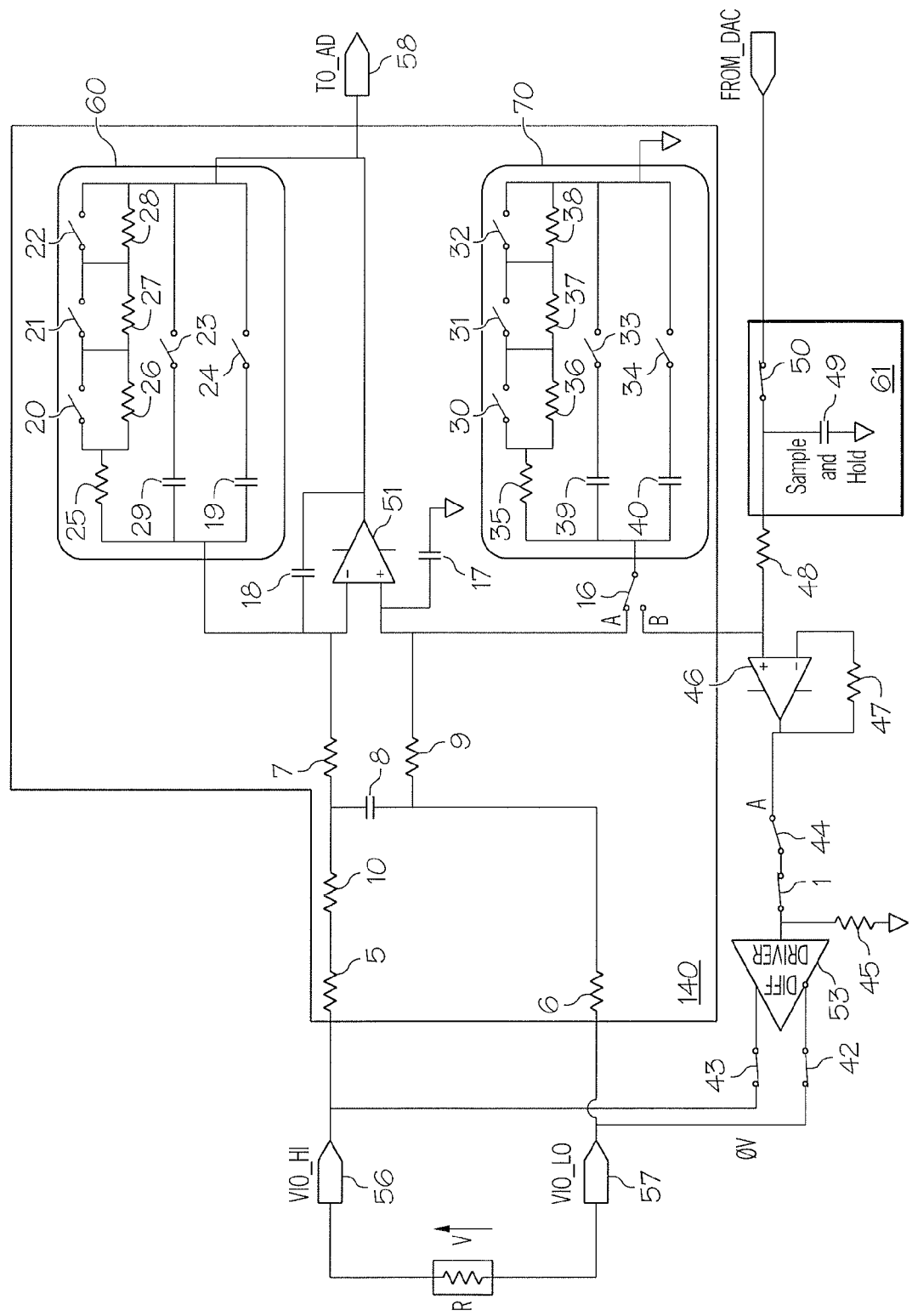
FIG. 13 illustrates an embodiment of the exemplary bi-directional signal conditioning circuit of FIG. 3 in a differential output configuration with differential feedback BIT.

The modality of FIG. 13 illustrates an embodiment that generates a differential output V across VIO$_{Hi}$ and VIO$_{Lo}$. The output V is therefore both connected to an external receiving device D and is connected to the input to the input amplifier stage 140 as described above. As such, the modality of FIG. 13 uses the input amplifier stage to perform continuous BIT on the output from the DAC 95 allowing the central controller to compare the intended output with the actual output at pin 59.

Figure 14:
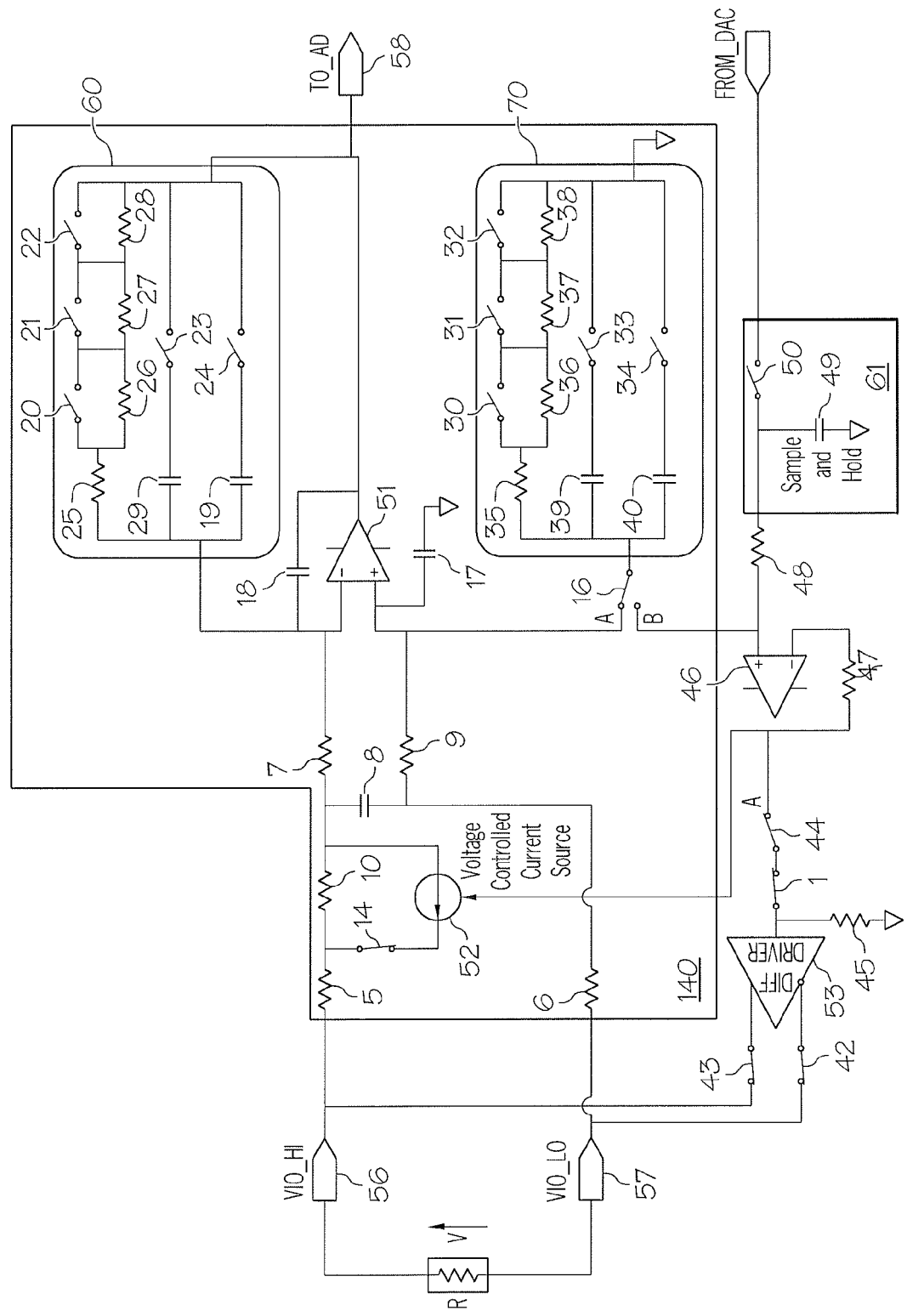
FIG. 14 illustrates an embodiment of the exemplary bi-directional signal conditioning circuit of FIG. 3 in a differential output configuration with differential feedback and injection BIT.

The modality of FIG. 14 illustrates an embodiment similar to that disclosed above in regard to FIG. 13, with the inclusion of a BIT driven by the voltage controlled current source 52 that injects a predetermined incremental current through resistor 10. The voltage signal induced in the resistor 10 is reflected across the capacitor 8 as an input for input amplifier 51 that amplifies/attenuates and filters the voltage signal for further processing by the central controller 94. The control voltage driving the voltage controlled current source 52 is generated by the operational amplifier 46 based on receiving a BIT input signal from the central controller 94 via the sample and hold sub-circuit 61.

Figure 15:
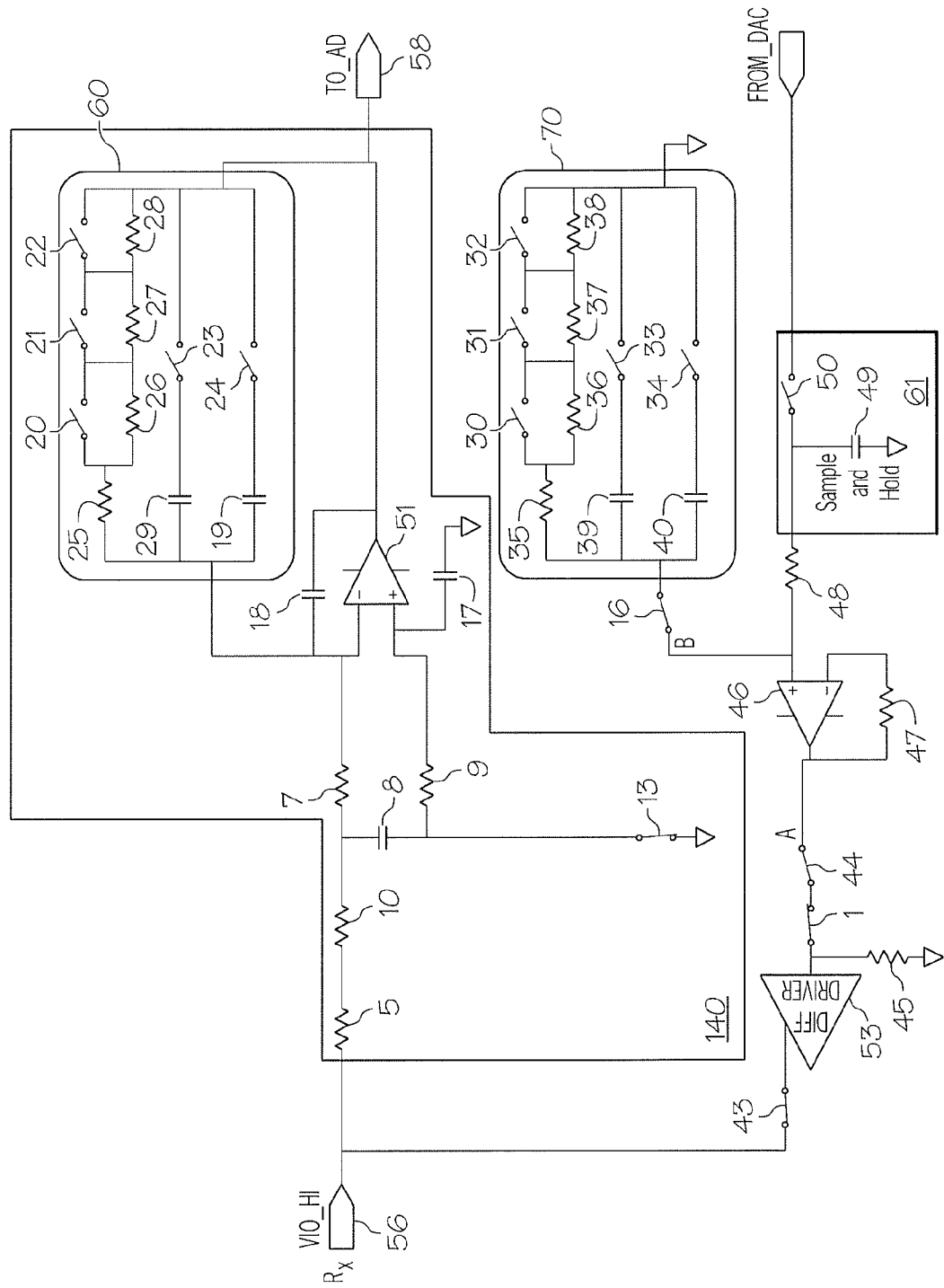
FIG. 15 illustrates an embodiment of the exemplary bi-directional signal conditioning circuit of FIG. 3 in a single ended output configuration with feedback BIT.

The modality of FIG. 15 illustrates an embodiment that transmits a single-ended output at pin VIOHi to an external receiving device Rx. The signal to be transmitted on pin VIOHi is generated in the central controller 94 for processing through the DAC 95, the sample and hold sub-circuit 61, operational amplifier 46 (e.g. a unity gain). Because configuration switch 16 is in the "B" position the RC network 70 acts as a filter and an attenuation control for the operational amplifier 46. Closing configuration switch 1 and configuration switch 44 couples the BIT signal from the operational amplifier 46 through the operational driver 53 to the pin VIOHi. Closing configuration switch 13 couples the non-inverting input of input amplifier 51 to ground. The input amplifier stage 140 is configured for single-ended operation and provides BIT capability by providing the central controller 94 the actual voltage output on VIOHi for comparison to the intended voltage.

Figure 16:
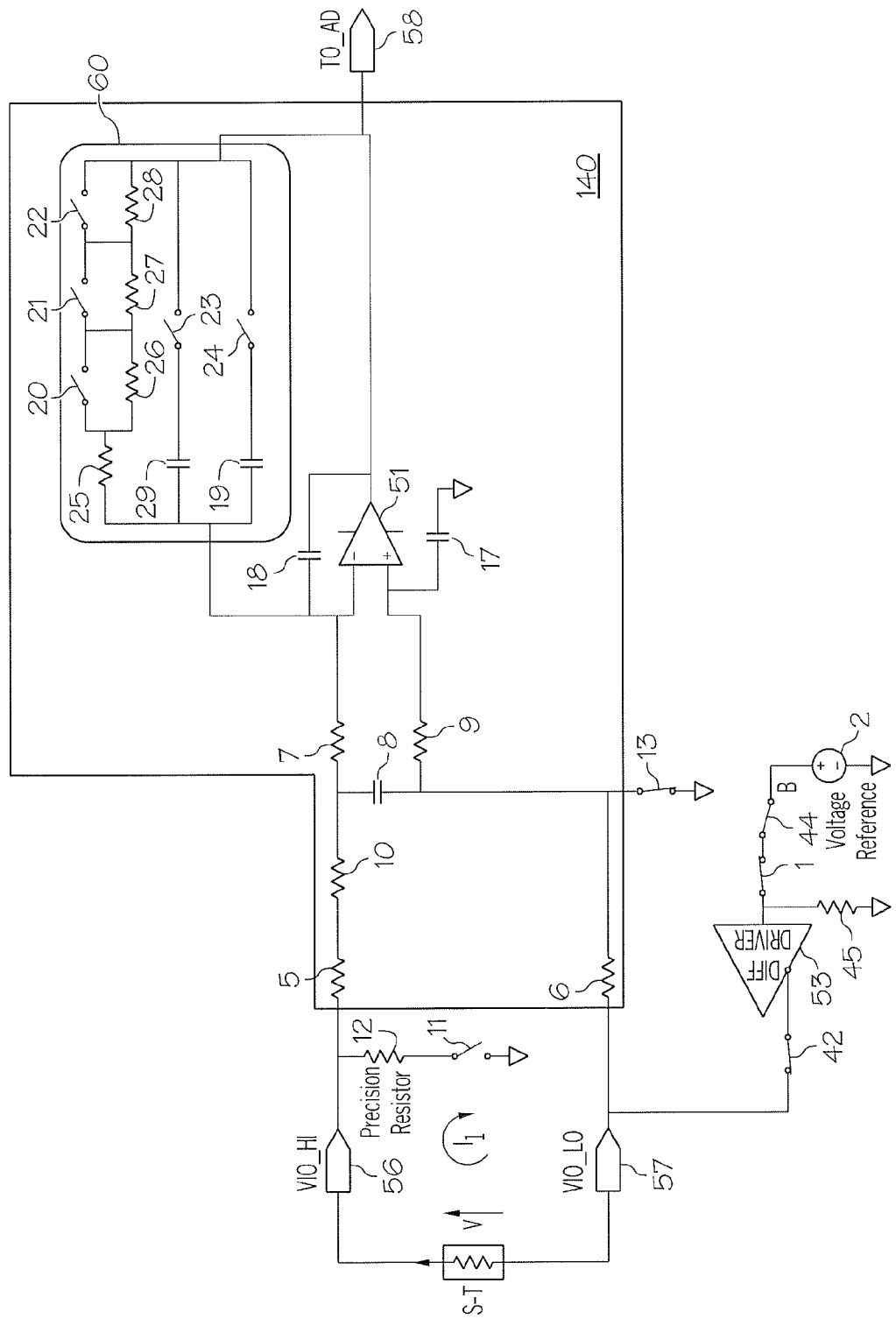
FIG. 16 illustrates an embodiment of the exemplary bi-directional signal conditioning circuit of FIG. 3 in a 4-20 mA input configuration.

The modality of FIG. 16 illustrates an embodiment that allows the signal conditioning module 98 to interface to sensor-transmitters (S-T) that provide sensor information compatible with the 4-20 mA current loop standard. In this mode pin VIOLo will act as the supply pin for the external sensor-transmitter device. Configuration switch 44 is in the "B" position and configuration switch 1 is closed. This applies the reference voltage (e.g. −10V) to the input of differential driver 53 which then drives pin VIOLo to the intended supply voltages (e.g. +10V). The external sensor-transmitter will use the supply and the sensed parameter to return a current to pin VIOHi. This current will flow through the precision resistor 12 to ground via configuration switch 11, which is closed. The current through precision resistor 12 creates a voltage at pin VIOHi that is conditioned by the input amplifier stage 140, which is configured to operate in the single-ended mode by closing configuration switch 13. The conditioned voltage is converted by the AD converter 93 and subsequently processing by the central controller 94.

Figure 17:
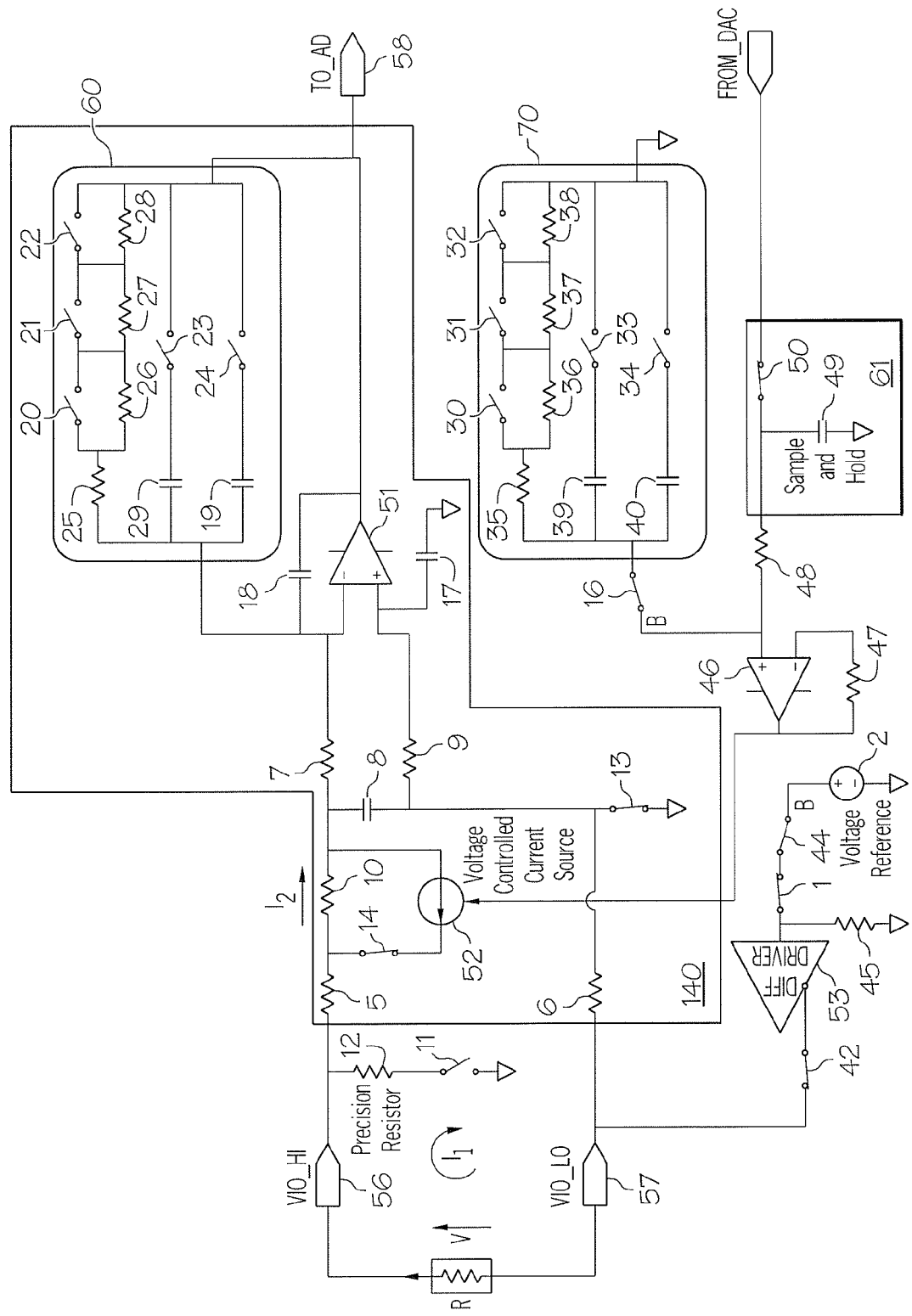
FIG. 17 illustrates an embodiment of the exemplary bi-directional signal conditioning circuit of FIG. 3 in a 4-29 mA input configuration with injection BIT.

The modality of FIG. 17 illustrates an embodiment that allows the circuit to interface to sensor-transmitters (S-T) that provide sensor information compatible with the 4-20 mA current loop as disclosed above in regard to FIG. 17. However, by closing configuration switch 14, the filtered and amplified output of the operational amplifier 46 is applied to the voltage controlled current source 52 which injects a predetermined current I2 through resistor 10. Voltage induced across resistor 10 reflects across capacitor 8 for analysis by central controller 94 after being filtered and amplified by input amplifier 51. The voltage controlling he current source is generated by the operational amplifier 46 based on an amplified/attenuated and filtered BIT signal received from central controller 94 via the sample and hold sub-circuit 61.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention. It being understood that various changes may be made in the function and arrangement of elements described in an exemplary embodiment without departing from the scope of the invention as set forth in the appended claims.

What is claimed is:

1. An interface circuit re-configurable to perform a plurality of interface functions, the circuit comprising:
    one or more configurable input signal paths;
    a first amplifier having at least a non-inverting input, the first amplifier being configured to receive one of a differential signal and a single ended signal via the one or more configurable input signal paths;
    a configurable impedance network having an input, the input of the configurable impedance network being switchably coupled to the non-inverting input of the first amplifier;
    a second amplifier having a non-inverting input and an output, the non-inverting input of the second amplifier being switchably coupled to the input of the configurable impedance network; and
    a third amplifier having an input and an output, the input of the third amplifier being switchably coupled to the output of the second amplifier, and the output of the third amplifier being coupled to the one or more input signal paths to the first amplifier.

2. The re-configurable interface circuit of claim 1 wherein the one or more configurable input signal paths includes a first resistor including an input and an output.

3. The re-configurable interface circuit of claim 2 further comprising a fixed current source with an output, the output of the fixed current source being coupled to the input of the first resistor.

4. The re-configurable interface circuit of claim 1 further comprising a voltage controlled current source, the voltage controlled current source being switchably coupled to the input of the first resistor and to the output of the first resistor.

5. The re-configurable interface circuit of claim 4, wherein the voltage controlled current source is driven by the output of the second amplifier.

6. The re-configurable interface circuit of claim 1 further comprising a reference voltage, the reference voltage being switchably coupled to the input of the third amplifier.

7. The re-configurable interface circuit of claim 1, wherein the third amplifier comprises a second output and is configured to amplify an input signal and output a pair of balanced differential voltage signals based on the input signal.

8. The re-configurable interface circuit of claim 1 further comprising a precision resistor with an input and an output, wherein the input is coupled to the input of the first resistor and the output is switchably coupled to ground.

9. The re-configurable interface circuit of claim 1 further comprising a sample and hold sub-circuit that comprises one of the one or more configurable input signal paths and is coupled to the input of the second amplifier.

10. An analog-interfacing system comprising:
    a digital-to-analog converter with an input and an output;
    a digital controller with an input and an output, the output of the digital controller coupled to the input of the digital-to-analog converter;
    an analog-to-digital converter with an input and an output; the output of the analog-to-digital converter coupled to the input of the digital controller; and an analog signal conditioning circuit with a plurality of inputs and a plurality of outputs, a first input of the of the plurality of inputs being coupled to the output of the digital-to-analog converter and a first output of the plurality being coupled to the input of the analog-to-digital converter, the analog signal conditioning circuit comprising a first amplifier having an inverting input and a non-inverting input, a first configurable impedance network having an input, the input of the first configurable impedance network being switchably coupled to the non-inverting input of the first amplifier;

a second amplifier having a non-inverting input and an output, the non-inverting input of the second amplifier being switchably coupled to the input of the first configurable impedance network;

a third amplifier having an input and an output, the input of the third amplifier being switchably coupled to an output of the second amplifier and the output of the third amplifier being coupled to at least one of the inverting input and the non-inverting input of the first amplifier.

11. The analog-interfacing system of claim 10 further comprising a first sample-and hold circuit coupled between the first output of the analog signal conditioning circuit and the analog-to-digital converter and a second sample-and hold circuit coupled between the output of the digital-to-analog converter and the first input of the analog signal conditioning circuit.

12. The analog-interfacing system of claim 10, wherein the analog signal conditioning circuit further comprises a second impedance network coupled to inverting input of the first amplifier.

13. The analog-interfacing system of claim 10 further comprising a resistor with an input and an output, the output coupled to inverting input of the first amplifier.

14. The analog-interfacing system of claim 13, further comprising a fixed current source with an output, the output of the fixed current source being switchably coupled to the input of the first resistor.

15. The analog-interfacing system of claim 14, further comprising a voltage controlled current source, the voltage controlled current source being switchably coupled to the input of the first resistor and the output of the first resistor.

16. The analog-interfacing system of claim 15, wherein the analog signal conditioning circuit further comprises:

a switch fabric, the switch fabric configured to receive the configuration inputs from the digital controller and re-configured the analog conditioning circuit in real time, the reconfiguring comprising:

coupling or decoupling the second amplifier from the input of the first configurable impedance network, coupling or decoupling the fixed current source from the input of the resistor, and coupling or decoupling the voltage controlled current source from the input of the resistor.

17. A re-configurable signal conditioning circuit, comprising:

means for receiving a first of one or more analog inputs;

means for outputting an analog output;

a first means for amplifying having an input and an output, the output of the first means for amplifying being coupled to the means for outputting an analog output and the input coupled to the means for receiving one or more analog inputs;

a means for filtering and gain control switchably coupled to the input of the first amplifying means;

a second means for amplifying having an input and an output, the input of the second means for amplifying being switchably coupled to means for filtering and gain control;

a third means for amplifying having an input and an output, the input of the third means for amplifying being switchably coupled to the output of the second means for amplifying and the output of the third means for amplifying being coupled to the means for receiving the one or more analog inputs; and a means for switching configured to switchably connect the means for filtering and gain control to the input of the first amplifying means, to switchably connect the means for filtering and gain control to the input of the second means for amplifying and to switchably connect the output of the second means for amplifying to the input of the third means for amplifying.

18. The re-configurable signal conditioning circuit of claim 17, further comprising means for injecting a current at the means for receiving the one or more analog inputs.

19. The re-configurable signal conditioning circuit of claim 17, further comprising a second means for filtering and gain control coupled to the input of the first amplifying means.

* * * * *